(12) United States Patent
Wells et al.

(10) Patent No.: US 11,856,860 B1
(45) Date of Patent: Dec. 26, 2023

(54) EXTRUDED MULTILAYER WITH ELECTRODES

(71) Applicant: META PLATFORMS TECHNOLOGIES, LLC, Menlo Park, CA (US)

(72) Inventors: Spencer Allan Wells, Seattle, WA (US); Kenneth Diest, Kirkland, WA (US); Wenhao Li, Redmond, WA (US); Sheng Ye, Redmond, WA (US); Renate Eva Klementine Landig, Seattle, WA (US); Andrew John Ouderkirk, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 469 days.

(21) Appl. No.: 16/775,619

(22) Filed: Jan. 29, 2020

Related U.S. Application Data

(60) Provisional application No. 62/914,388, filed on Oct. 11, 2019.

(51) Int. Cl.
| | |
|---|---|
| *H01B 1/22* | (2006.01) |
| *H10N 30/87* | (2023.01) |
| *H01B 13/00* | (2006.01) |
| *H01B 1/24* | (2006.01) |
| *C09D 11/52* | (2014.01) |

(Continued)

(52) U.S. Cl.
CPC .......... *H10N 30/878* (2023.02); *C09D 11/52* (2013.01); *H01B 1/22* (2013.01); *H01B 1/24* (2013.01); *H01B 13/0036* (2013.01); *H10N 30/06* (2023.02); *H10N 30/857* (2023.02)

(58) Field of Classification Search
CPC ... H01B 1/20; H01B 1/22; H01B 1/24; C09D 5/24; C09D 11/52
See application file for complete search history.

(56) References Cited

U.S. PATENT DOCUMENTS

| | | | |
|---|---|---|---|
| 7,569,160 B2 * | 8/2009 | Oldenzijl ............... | C09D 11/52 252/502 |
| 10,851,257 B2 * | 12/2020 | Shukla ................ | C09D 101/28 |

(Continued)

OTHER PUBLICATIONS

Balan et al. "A new and convenient route to polyacrylate/silver nanocomposites . . . ", Progress in Organic Coatings 62 (2008) 351-357.*

(Continued)

*Primary Examiner* — Mark Kopec
(74) *Attorney, Agent, or Firm* — Greenberg Traurig, LLP

(57) ABSTRACT

A liquid dispersion includes a matrix phase of polymerizable material and at least 10% by volume of solid conductive particles distributed throughout the matrix. The conductive particles may have an average particle size of less than approximately 100 nm, and the liquid dispersion may have a viscosity of less than approximately 100 Poise. Such a liquid dispersion may be printed or extruded and then cured to form a solid thin film. The content and distribution of conductive particles within the thin film may reach a percolation threshold such that the thin film may form a conductive layer. Polymer-based devices, such as nano-voided polymer (NVP)-based actuators may be formed by co-extrusion of a nanovoided polymer material between conductive polymer electrodes.

8 Claims, 14 Drawing Sheets

(51) Int. Cl.
*H10N 30/06* (2023.01)
*H10N 30/857* (2023.01)

(56) References Cited

U.S. PATENT DOCUMENTS

| | | | | |
|---|---|---|---|---|
| 2009/0242854 | A1* | 10/2009 | Li | H05K 1/097 252/519.33 |
| 2015/0263192 | A1* | 9/2015 | Muschelknautz | H01L 31/022425 252/514 |
| 2018/0171168 | A1* | 6/2018 | Jiang | C09D 11/102 |
| 2018/0179396 | A1* | 6/2018 | Iacob | H01B 1/22 |
| 2019/0308880 | A1* | 10/2019 | Tour | B33Y 10/00 |

OTHER PUBLICATIONS

Barszczewska-Rybarek "Studies on the curing efficiency and mechanical properties of bis-GMA and TEGDMA Nanocomposites containing silver nanoparticles", Int. J. Mol. Sci. 2018, 19, 3937.*

Saleh et al. "3D inkjet-printed UV-curable inks for multi-functional electromagnetic applications", Additive Manufacturing 13 (2017) 143-148.*

McMorrow et al. "Polymer Matrix Nanocomposites by Inkjet Printing", 2005 International Solid Freeform Fabrication Symposium (Aug. 2005) pp. 174-183. (Year: 2005).*

Chartoff et la "Functionally graded polymer matrix nanocomposites by solid freeform fabrication: a preliminary report", 2003 International Solid Freeform Fabrication Symposium pp. 385-391. (Year: 2003).*

Zaier et al "Generating highly reflective and conductive metal layers through a light-assisted synthesis and assembling of silver nanoparticles in a polymer matrix", Scientific Reports 7:12410 (Sep. 2017) 10 pages. (Year: 2017).*

Jiang et al., "Transparent Electro-Optic Ceramics and Devices", URL: http://www.bostonati.com/whitepapers/SPIE04paper, as accessed on Aug. 15, 2019, 15 pages.

Zhao et al., "Spherical aberration free liquid-filled tunable lens with variable thickness membrane", Optics Express, vol. 23, No. 16, Aug. 10, 2015, pp. 21264-21278.

Wei, J, "Wafer Bonding Techniques for Microsystem Packaging", Journal of Physics: Conference Series, vol. 34. No. 1, 2006, pp. 943-948.

Schott, "Bonding the Future", URL: https://www.schott.com/primoceler/hermetic-glass-bonding/, as accessed on Aug. 15, 2019, 9 pages.

Lee et al., "Enhanced optical properties and thermal stability of optically clear adhesives", International Journal of Adhesion and Adhesives, vol. 50, 2014, pp. 93-95.

Lee et al., "Optical properties and adhesion performance of optically clear acrylic pressure sensitive adhesives using chelate metal acetylacetonate", International Journal of Adhesion and Adhesives, vol. 47, 2013, pp. 21-25.

Czech et al., "Photoreactive UV-crosslinkable solvent-free acrylic pressure-sensitive adhesives containing copolymerizable photoinitiators based on benzophenones", European Polymer Journal, vol. 48, No. 8, 2012, pp. 1446-1454.

Baek et al., "Preparation and adhesion performance of transparent acrylic pressure sensitive adhesives: effects of substituent structure of acrylate monomer", International Journal of Adhesion and Adhesives, vol. 64, 2016, pp. 72-77.

Lee et al., "Transparent Conductive Multilayer Films with Optically Clear Adhesive Interlayer for Touch Panel Devices", Journal of Applied Science, vol. 10, No. 12, 2010, pp. 1104-1109.

Jin et al., "Properties of solvent-borne acrylic pressure-sensitive adhesives synthesized by a simple approach", eXPRESS Polymer Letters, vol. 3, No. 12, 2009, pp. 814-820.

* cited by examiner

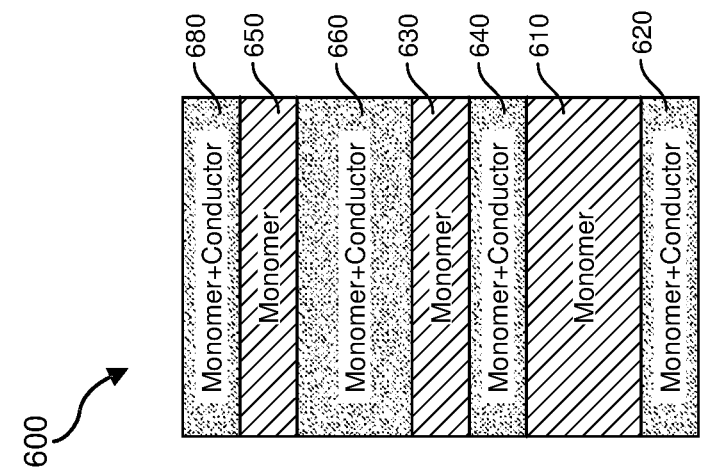
FIG. 6
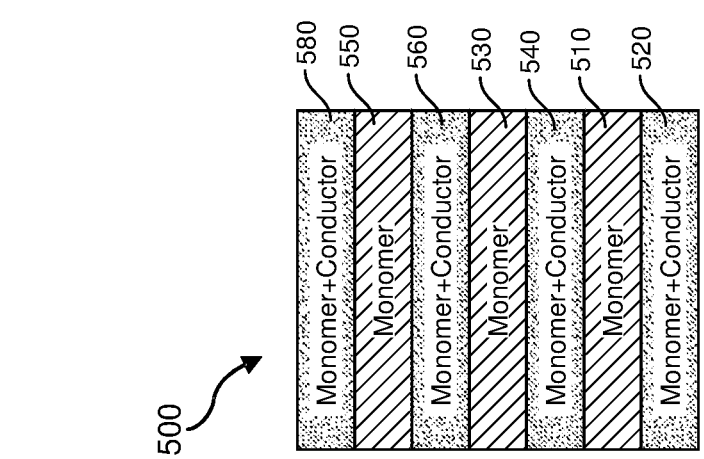
FIG. 5
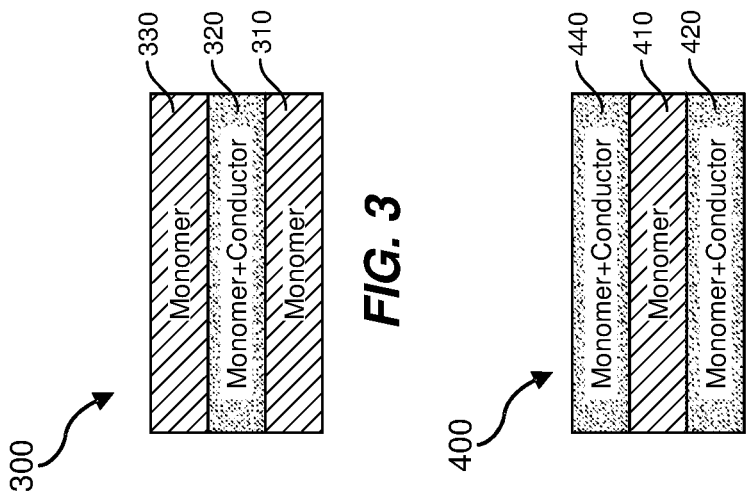
FIG. 3
FIG. 4

EXTRUDED MULTILAYER WITH ELECTRODES

CROSS-REFERENCE TO RELATED APPLICATION

This application claims the benefit of priority under 35 U.S.C. § 119(e) of U.S. Provisional Application No. 62/914,388, filed Oct. 11, 2019, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 3 is a schematic illustration of an example ABA tri-layer architecture at an intermediate stage of fabrication according to some embodiments.

FIG. 4 is a schematic illustration of an example BAB tri-layer architecture at an intermediate stage of fabrication according to some embodiments.

FIG. 5 is a schematic illustration of an example BABAB-multilayer architecture at an intermediate stage of fabrication according to some embodiments.

FIG. 6 is an illustration of an example multilayer architecture at an intermediate stage of fabrication having individual layers of varying thickness according to certain embodiments.

Figure 1:
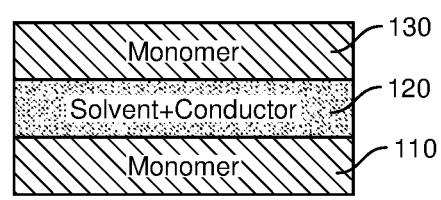
FIG. 1 is a schematic illustration of a comparative multilayer architecture at an intermediate stage of fabrication.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Polymer materials may be incorporated into a variety of different optic and electro-optic device architectures, including active and passive optics and electroactive devices. Electroactive polymer (EAP) materials, for instance, may change their shape under the influence of an electric field. EAP materials have been investigated for use in various technologies, including actuation, sensing and/or energy harvesting. Lightweight and conformable, electroactive polymers may be incorporated into wearable devices such as haptic devices and are attractive candidates for emerging technologies including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film polymer materials, including the refractive index to manipulate light and/or in some applications, an electroactive response to generate a deformation of a polymer layer when stimulated by an electric field. In some embodiments, the electroactive response may include a mechanical response to an electrical input that varies over the spatial extent of the device, with the electrical input being applied by a control circuit to a layer of electroactive material located between paired electrodes. The mechanical response may be termed an actuation, and example devices may be, or include, actuators. Deformation of the electroactive polymer may be used to actuate optical elements in an optical assembly such as a lens system and provide, for example, focus or aberration control. In particular embodiments, a deformable optical element and an electroactive polymer layer may be co-integrated whereby the optical element may itself be actuatable. Notwithstanding recent developments, it would be advantageous to provide improved manufacturing methods to form multilayer structures and devices, such as an electroactive polymer layer disposed between a pair of conductive electrodes.

The present disclosure is generally directed to the formation of multilayer architectures, and more particularly to the co-integration of manufacturing methods for forming an electroactive polymer layer and an electrically-conductive layer (i.e., electrode) adjacent to the electroactive polymer layer. The disclosed multilayer architectures may be incorporated into, or otherwise form, a polymer-based actuator or sensor, etc. A nanovoided polymer actuator, for instance, may include a pair of conductive electrodes and an elastomeric, nanovoided polymer matrix disposed between the electrodes.

As used herein, "electroactive polymers" may, in some examples, refer to polymers that exhibit a change in size or shape when stimulated by an electric field. Some electroactive polymers may find limited applications due to a low breakdown voltage with respect to the operating voltage used by electroactive devices (e.g., actuators). Electroactive devices with reduced operating voltages and higher energy densities may be useful for many applications.

The physical origin of the compressive nature of electroactive polymers in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, as well as the dielectric constant and the elastic compliance of the electroactive polymer. Compliance in this case is the change of strain with respect to stress or, equivalently, in more practical terms, the change in displacement with respect to force.

As used herein, an "elastomer" or "elastomeric" material may, in some examples, refer to a material with viscoelasticity (i.e., both viscosity and elasticity), generally low elastic modulus (a measure of the stiffness of a solid material), and high failure strain compared with other materials. In some embodiments, an electroactive polymer may include an elastomer material that has an effective Poisson's ratio of less than approximately 0.35 (e.g., less than approximately 0.3, less than approximately 0.25, less than approximately 0.2, less than approximately 0.15, less than approximately 0.1, or less than approximately 0.05, including ranges between any of the foregoing values). In at least one example, an elastomer material may have an effective density that is less than approximately 90% (e.g., less than approximately 80%, less than approximately 70%, less than approximately 60%, less than approximately 50%, or less than approximately 40%) of the elastomer when densified (e.g., when the elastomer is compressed by an applied voltage). An "effective density" may, in some examples, be determined as the density of a nanovoided material divided by the density of an equivalent volume of un-voided material.

Example polymer materials forming electroactive polymers may include, without limitation, styrenes, polyesters, polycarbonates, epoxies and/or halogenated polymers. Additional example electroactive polymer materials may include silicone-based polymers, such as poly(dimethyl siloxane), and acrylic polymers, such as ethyl acrylate, butyl acrylate, octyl acrylate, ethoxyethoxy ethyl acrylate, chloromethyl acrylate, methacrylic acid, dimethacrylate oligomers, allyl glycidyl ether, fluorinated acrylates, cyanoacrylate or N-methylol acrylamide. Still further example electroactive polymer materials may include silicone acrylate polymers, and urethane polymers, as well as mixtures of any of the foregoing.

In some embodiments, the electroactive polymer layer may be a substantially dense layer. In alternate embodiments, the electroactive polymer layer may include a porous layer, such as a nanovoided polymer layer. As used herein the terminology "nanovoids," "nanoscale voids," "nanovoided," and the like, may refer to voids having at least one sub-micron dimension, i.e., a length and/or width and/or depth, of less than 1000 nm. In some embodiments, the void size may be between approximately 10 nm and approximately 1000 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, or approximately 1000 nm, including ranges between any of the foregoing values).

In example nanovoided polymers, the nanovoids may be randomly distributed throughout the polymer matrix, without exhibiting any long-range order, or the nanovoids may exhibit a regular, periodic structure having a regular void-to-void repeat distance of approximately 20 nm to approximately 1000 nm. In both disordered and ordered structures, the nanovoids may be discrete, closed-celled voids, open-celled voids that may be at least partially interconnected, or combinations thereof. For open-celled voids, the void size (d) may be the minimum average diameter of the cell. The voids may be any suitable size and, in some embodiments, the voids may approach the scale of the thickness of a nanovoided polymer layer.

In certain embodiments, the nanovoids may occupy approximately 1% to approximately 90% by volume of the nanovoided polymer matrix, e.g., approximately 1%, approximately 2%, approximately 5%, approximately 10%, approximately 20%, approximately 30%, approximately 40%, approximately 50%, approximately 60%, approximately 70%, approximately 80%, or approximately 90%, including ranges between any of the foregoing values.

According to some embodiments, the nanovoids may be substantially spherical, although the void shape is not particularly limited. For instance, in addition to, or in lieu of spherical voids, the nanovoided polymer material may include voids that are oblate, prolate, lenticular, ovoid, or any other regular or irregular form, and may be characterized by a convex and/or a concave cross-sectional shape. The void shape may be isotropic or anisotropic. Moreover, the topology of the voids throughout the polymer matrix may be uniform or non-uniform.

As used herein "topology" with reference to the nanovoids refers to their overall arrangement within the nanovoided polymer matrix and may include their size and shape as well as their respective distribution (density, periodicity, etc.) throughout the electroactive polymer matrix. According to various embodiments, nanovoids may be distributed homogeneously or non-homogeneously. In certain embodiments, the nanovoided polymer may have a "spatially-varying topology" whereby at least one topological feature may change as a function of position. By way of example, the size of the voids and/or the void size distribution may vary spatially within the nanovoided polymer material, i.e., laterally and/or with respect to a thickness of a nanovoided polymer layer. In further aspects, a nanovoided polymer thin film may have a constant density of nanovoids or the density of nanovoids may increase or decrease as a function of position, e.g., as a function of the layer thickness. Adjusting the void fraction of an EAP, for instance, can be used to tune its compressive stress-strain characteristics.

In some embodiments, an elastomeric polymer matrix (e.g., a nanovoided polymer matrix) may be characterized by an elastic modulus of less than approximately 10 GPa (e.g., approximately 10 GPa, approximately 5 GPa, approximately 2 GPa, approximately 1 GPa, approximately 0.5 GPa, approximately 0.2 GPa, approximately 0.1 GPa, approximately 0.05 GPa, approximately 0.02 GPa, approximately 0.01 GPa, approximately 0.005 GPa, approximately 0.002 GPa, or approximately 0.001 GPa, including ranges between any of the foregoing values).

In accordance with various embodiments, an electroactive polymer layer such as a nanovoided polymer layer may be disposed between a primary electrode and a secondary electrode. According to some embodiments, an actuator or sensor may include a primary electrode, a secondary electrode overlapping at least a portion of the primary electrode, and an electroactive polymer layer disposed between and abutting the primary electrode and the secondary electrode.

The electrodes (e.g., the primary electrode and the secondary electrode) may include regions of conductive material dispersed within an otherwise insulating matrix. That is, the electrodes may include a polymer matrix and a plurality of conductive particles distributed throughout the polymer. As disclosed in further detail herein, the concentration of conductive particles may be effective to reach a percolation threshold such that the overall electrode structure may be electrically conductive. Moreover, the formation of such electrodes may be compatible with the formation of the electroactive polymer layers.

Example methods for forming a multilayer having an electroactive polymer layer and one or more adjacent electrode layers include printing (e.g., inkjet printing or gravure printing) and extruding, although additional deposition methods are contemplated, such as spray coating, dip coating, and doctor blading. In some embodiments, an electroactive polymer layer and an electrode layer may be formed separately and subsequently laid up and bonded. In exemplary embodiments, an electroactive polymer layer and one or more electrode layers may be formed simultaneously, such as by co-extrusion of suitable precursor compositions.

According to some embodiments, the electroactive polymer layer may be formed by depositing a polymer precursor composition containing a curable material, e.g., onto a substrate, and curing the polymer precursor to form a polymer matrix. The polymer precursor composition may be, or include, a liquid. In addition to the curable material, the polymer precursor composition may include one or more of a porogen, polymerization initiator, surfactant, emulsifier, and/or other additive(s) such as cross-linking agents. In some embodiments, various components of the polymer precursor composition may be combined into a single mixture and deposited simultaneously. Alternatively, the various components may be deposited individually (i.e., in succession), or in any suitable combination(s).

By way of example, the electroactive polymer layer may be formed by depositing a polymer precursor composition containing a curable material and a porogen, curing the polymer precursor to form a polymer matrix, and selectively removing the porogen from the polymer matrix to form a porous (e.g., nanovoided) polymer.

According to some embodiments, the electrode layer may be formed by depositing an electrode precursor composition containing a curable material and particles of a conductive material, e.g., onto a substrate, and curing the polymer precursor to form a polymer matrix. Prior to curing, the conductive particles may be dispersed within the curable material by shear mixing or ultrasonication. In certain embodiments, the surface of the conductive particles may be modified, e.g., chemically modified, to improve their rheological properties. The electrode precursor composition may be, or include, a liquid and may further include one or more of a polymerization initiator or a cross-linking agent. In certain embodiments, the electrode precursor composition may be free of a liquid solvent. Example liquid solvents that may be excluded from the electrode precursor composition include water, alcohols, and other organic and inorganic liquids that may, upon evaporation, cause a volume change of the deposited electrode.

Figure 1A:
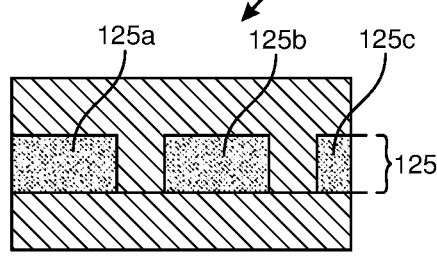
FIGS. 1A and 1B illustrate the possible effects of conventional processing on the multilayer architecture of FIG. 1.
Figure 1B:
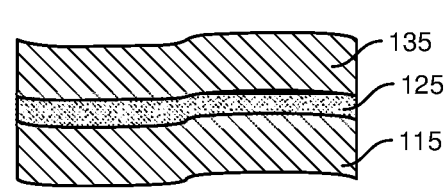

As will be appreciated, although a liquid solvent may be used to decrease the viscosity and improve the processability of an electrode precursor composition, Applicants have shown that by eliminating the liquid solvent from the electrode precursor composition, drying phenomena associated with solvent evaporation, such as uncontrolled shrinkage and matrix collapse during solvent removal, may be avoided. By way of illustration, FIG. 1 shows a comparative multilayer architecture at an intermediate stage of fabrication. The comparative multilayer structure 100 includes opposing polymer precursor layers 110, 130 and an intervening electrode precursor layer 120. The comparative electrode precursor layer 120 may include conductive particles dispersed in a liquid solvent. During drying, and with reference to FIG. 1A, solvent removal may induce collapse of the polymer, segregation of the electrode layer 125 into discrete segments 125a, 125b, 125c and an attendant loss of electrical continuity. Additionally or alternatively, as shown in FIG. 1B, solvent removal may induce unwanted distortions in the electrode layer 125 and/or in the adjacent electroactive polymer layers 115, 135.

In accordance with various embodiments, a multilayer architecture including electrodes may be formed by co-depositing a polymer precursor composition and a solvent-free electrode precursor composition. The electrode precursor composition may include a low viscosity curable material that facilitates processability and compatibility with deposition of the polymer precursor composition while obviating large volume changes and the attendant loss of mechanical stability associated with solvent removal.

The curable material used to form the electrode precursor composition and the polymer precursor composition may be independently selected from a variety of materials, including acrylates (such as polymethyl methacrylate, ethyl acrylate, butyl acrylate, di-, tri-, and poly functional acrylates for crosslinkers), silicones (including those based on polydimethyl siloxanes), silicone acrylates, thiols, thiol acrylates, silanes, vinyls, isocyanates, epoxies, urethanes, and combinations thereof. In example multilayer structures, the same or different polymers may be used for the electrode layers and the electroactive polymer layer(s).

The conductive particles may include one or more suitable conductive materials, such as graphite, graphene, graphene oxide, gold nanoparticles, silver nanoparticles, palladium nanoparticles, platinum nanoparticles, transparent conductive oxides, carbon nanotubes, carbon black, poly(3,4-ethylenedioxythiophene), polystyrene sulfonate, or another conductive polymer. In some embodiments, the conductive particles may be characterized by sub-micron dimensions. For instance, example conductive particles may have an average smallest dimension (i.e., length, width, depth, diameter, etc.) of less than approximately 100 nm, e.g., 5, 10, 20, 50 or 100 nm, including ranges between any of the foregoing values.

In certain embodiments, the electrode precursor composition may further include a surfactant. A surfactant may improve the dispersion of conductive particles and improve the stability of the electrode precursor composition. Example surfactants may include epoxy monomers, epoxy acrylates, polyimides, mono(meth)acrylates, di(meth)acrylates, ethylene oxide-modified diols, ethylene oxide-modified acrylates, as well as combinations thereof. If provided, a surfactant may be polymerizable or non-polymerizable.

The electrode precursor composition may, in some embodiments, have a viscosity at 23° C. of less than approximately 10000 cP, e.g., less than approximately 10000 cP, less than approximately 5000 cP, less than approximately 2000 cP, less than approximately 1000 cP, less than approximately 500 cP, less than approximately 200 cP, less than approximately 100 cP, less than approximately 50 cP, less than approximately 20 cP, less than approximately 10 cP, less than approximately 5 cP, or less than approximately 2 cP, including ranges between any of the foregoing values.

According to some embodiments, the precursor coating thickness (i.e., a deposited coating of the electrode precursor composition and/or the polymer precursor composition) may range from approximately 10 nm to approximately 10 millimeters, e.g., approximately 10 nm, approximately 20 nm, approximately 50 nm, approximately 100 nm, approximately 200 nm, approximately 500 nm, approximately 1 micrometer, approximately 2 micrometers, approximately 5 micrometers, approximately 10 micrometers, approximately 20 micrometers, approximately 50 micrometers, approximately 100 micrometers, approximately 200 micrometers, approximately 500 micrometers, approximately 1000 micrometers, approximately 2000 micrometers, approximately 5000 micrometers, or approximately 10000 micrometers, including ranges between any of the foregoing values.

The one or more deposited layers may form a precursor coating that may be cured to cross-link and polymerize the curable material. In some embodiments, cross-linking and/or polymerization may be achieved by exposing the precursor coating(s) to heat or actinic radiation. In some examples, "actinic radiation" may refer to energy capable of breaking covalent bonds in a material. Examples include electrons, electron beams, x-rays, gamma rays, ultraviolet and visible light, and ions at appropriately high energy levels. Further sources of actinic radiation may include a laser (e.g., a UV, IR, or visible laser) or light emitting diode (LED). A single UV lamp or a set of UV lamps, for instance, may be used as a source for actinic radiation.

Additionally or alternatively, a heat source such as a heat lamp or an array of filaments may generate heat to initiate reaction between monomers, monomer initiators, and/or cross-linking agents. The monomers, monomer initiators, and/or cross-linking agents may react upon heating and/or actinic radiation exposure to form a polymer as described herein.

The curable material may include monomers that may be monofunctional or polyfunctional, or mixtures thereof. Polyfunctional monomers may be used as crosslinking agents to add rigidity or to form elastomers. Polyfunctional monomers may include difunctional materials such as bisphenol fluorene (EO) diacrylate, trifunctional materials such as trimethylolpropane tri-acrylate (TMPTA), and/or higher functional materials. Other types of monomers may be used, including, for example, isocyanates, and these may be mixed with monomers with different curing mechanisms.

In some embodiments, polymerization may be free radical initiated. Free radical initiation may be performed by exposure to actinic radiation or heat. In addition to, or in lieu of, actinic radiation and heat-generated free radicals, polymerization of the curable material may be atom transfer radical initiated, electrochemically initiated, plasma initiated, or ultrasonically initiated, as well as combinations of the foregoing. In certain embodiments, example additives to the polymer precursor composition and/or electrode precursor composition that may be used to induce free radical initiation include azo compounds, peroxides, and halogens.

In some embodiments, a polymerization catalyst may be used. Example polymerization catalysts, which may be incorporated into the polymer precursor composition and/or the electrode precursor composition, include, hydrosilylation catalysts, polyamines, sulfur, styrenes, epoxies, isocyanates, and higher fatty acids or their esters, as well as combinations thereof.

According to some embodiments, curing may be performed during a deposition step, or curing may be performed after depositing one or more layers. In some embodiments, the polymerization process may not be limited to a single curing step. Rather, it may be possible to carry out polymerization by two or more steps, whereby, as an example, a precursor coating may be exposed to two or more lamps of the same type or two or more different lamps in sequence. The curing temperature of different curing steps may be the same or different. The lamp power and dose from different lamps may also be the same or different. In one embodiment, the polymerization may be carried out in air; however, polymerizing in an inert gas atmosphere such as nitrogen or argon is also contemplated.

In various aspects, the curing time may depend on the reactivity of the precursor coating, the thickness of the precursor coating, and the dose of actinic radiation or heat flux, for example. In some examples, the curing time may be approximately less than 5 minutes, less than 3 minutes, or less than 1 minute. In another embodiment, short curing times of less than 30 seconds may be used for mass production.

According to some embodiments, cross-linking and/or polymerization may impact one or more physical, e.g., rheological, properties of the precursor coating(s). For instance, in some examples, curing may: (a) increase the elastic modulus of a precursor coating by at least a factor of approximately 10, e.g., a factor of 10, 50, 100, 500, or 1000, including ranges between any of the foregoing values, (b) increase the viscosity of a precursor coating by at least a factor of approximately 10, e.g., a factor of 10, 50, 100, 500, or 1000, including ranges between any of the foregoing values, (c) increase the glass transition temperature of a precursor coating by at least a factor of approximately 10, e.g., a factor of 10, 50, 100, 500, or 1000, including ranges between any of the foregoing values, and/or (d) increase the melting temperature of a precursor coating by at least a factor of approximately 10, e.g., a factor of 10, 50, 100, 500, or 1000, including ranges between any of the foregoing values.

Particular embodiments relate to the formation of a liquid dispersion (electrode precursor composition) of cross-linkable/polymerizable monomers and conductive particles that may be deposited to form a thin film and cured to form a solid, electrically conductive layer, where the liquid-to-solid phase change may be accompanied by a volume change of less than approximately 10%, e.g., less than approximately 10%, less than approximately 5%, less than approximately 2%, or less than approximately 1%, including ranges between any of the foregoing values.

Such a liquid dispersion may include a mixture of at least 10 vol. % conductive particles within a network of polymerizable molecules, where the mixture has a viscosity of less than approximately 100 Poise and the conductive particles have an average particle size of less than approximately 100 nm. Following deposition, the curing and associated solidification of the electrode precursor composition may form a conductive electrode, where electrical conductivity may be achieved by long-range connectivity of the conductive particles within a network of polymerized molecules. That is, in the composite structure of conductive particles distributed throughout an insulating polymer matrix, electrical conductivity of the composite may be realized when the fraction of conductive particles reaches the percolation threshold.

Figure 2:
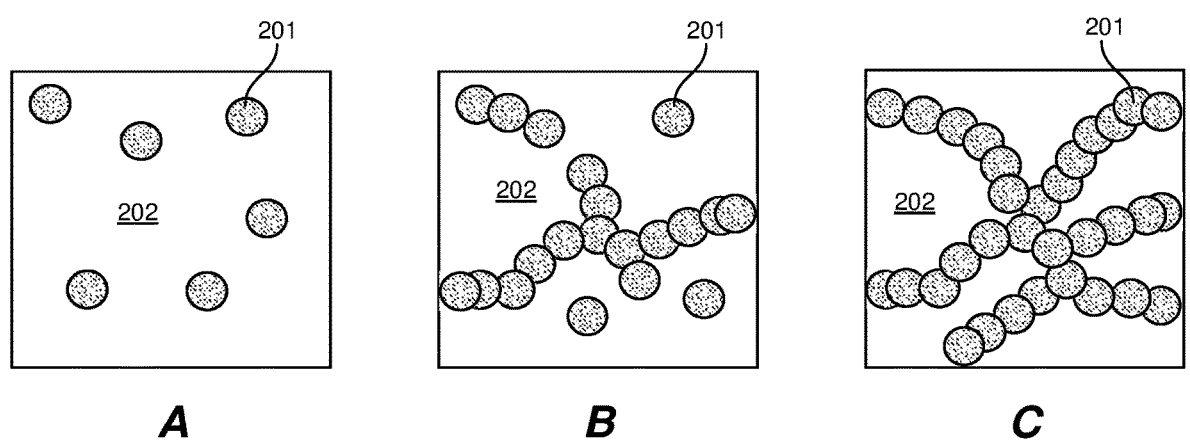
FIG. 2 shows the progression of an increasing volume fraction of conductive particles within a polymer matrix according to certain embodiments.

Referring to FIG. 2, a series of schematic diagrams illustrate a progressively greater content of conductive particles 201 within a polymer matrix 202. As shown in FIG. 2A, at approximately 10% loading, the illustrated non-conducting structure includes a plurality of isolated conductive particles 201. Referring to FIG. 2B and FIG. 2C, at approximately 23% loading and approximately 35% loading, respectively, conductive particles 201 may form one or more continuous, bridging conducting paths across the polymer matrix 202, where an increasingly greater percentage of the embedded conductive particles may contribute to the conductivity. In example embodiments, the conductive particle content within a polymer layer may range from approximately 0 vol. % to approximately 99 vol. %, e.g., approximately 0%, approximately 1%, approximately 2%, approximately 5%, approximately 10%, approximately 20%, approximately 30%, approximately 40%, approximately 50%, approximately 60%, approximately 70%, approximately 80%, approximately 90%, approximately 95%, approximately 97%, approximately 98%, or approximately 99% by volume, including ranges between any of the foregoing values.

The deposited electrodes (e.g., the primary electrode and the secondary electrode) in some configurations may be configured to stretch elastically. Moreover, the electrodes may be selected to achieve a desired deformability, transparency, and optical clarity for a given application. By way of example, the yield point of a deformable electrode may occur at an engineering strain of at least 0.5%.

In some embodiments, one or more electrodes may be electrically interconnected, e.g., through a contact layer, to a common electrode. In some embodiments, an actuator or other device may have a first common electrode connected to a first plurality of electrodes, and a second common electrode connected to a second plurality of electrodes. In some embodiments, electrodes (e.g., one of a first plurality of electrodes and one of a second plurality of electrodes) may be electrically isolated from each other using an insulator, such as a dielectric layer.

An insulator may include a material without appreciable electrical conductivity, and may include a dielectric material, such as, for example, an acrylate or silicone polymer. In some embodiments, an electrode (or other electrical connector) may include a metal. In some embodiments, an electrode (such as an electrical contact) or an electrical connector may include a similar material to other similar components.

The application of a voltage between the electrodes can cause compression of the intervening electroactive polymer layer(s) in the direction of the applied electric field and an associated expansion or contraction of the polymer layer(s) in one or more transverse dimensions as described by the Poisson's ratio for the material. In some embodiments, an applied voltage (e.g., to the primary electrode and/or the secondary electrode) may create at least approximately 0.01% strain (e.g., an amount of deformation in the direction of the applied force resulting from the applied voltage divided by the initial dimension of the material) in the gas-impregnated electroactive polymer element(s) in at least one direction (e.g., an x, y, or z direction with respect to a defined coordinate system).

In some embodiments, a primary electrode may overlap (e.g., overlap in a parallel direction) at least a portion of a secondary electrode. The primary and secondary electrodes may be generally parallel and spaced apart. A tertiary electrode may overlap at least a portion of either the primary or secondary electrode. An actuator or sensor may include a first electroactive polymer (e.g., an elastomer material) that may be disposed between a first pair of electrodes (e.g., the primary electrode and the secondary electrode). The actuator or sensor may further include a second electroactive polymer, which may be disposed between a second pair of electrodes (e.g., the primary electrode and a tertiary electrode). In some embodiments, there may be an electrode that is common to both the first pair of electrodes and the second pair of electrodes.

The multilayer structures disclosed herein may be incorporated into a variety of different devices. An electroactive device such as an actuator, for instance, may include a primary electrode, a secondary electrode overlapping at least a portion of the primary electrode, and an electroactive polymer layer disposed between and abutting the primary electrode and the secondary electrode. In some embodiments, such an actuator may be a component of a wearable device. The wearable device may include a helmet or other headwear, an eyewear frame, a glove, a belt, or any device configured to be positioned adjacent to or proximate the body of a user, and which may be adapted to provide, for example, a tactile signal to the user.

An electroactive device may be configured to provide an electrical signal correlated with a configuration of a body part, such as a joint angle. For example, the electrical signal may be used to determine a joint angle of a finger portion, wrist, elbow, knee, ankle, toe, or other body joint, or the bend angle of a mechanical device. For example, the wearable device may be a glove, and the electroactive device may be configured to provide an electrical signal based, at least in part, on a joint angle within a hand of the user wearing the glove, such as the angle between segments of a finger. In some embodiments, a method includes generating an electroactive response in an electroactive device, the electroactive device including an electroactive polymer layer located between a primary electrode and a secondary electrode, wherein the electroactive response to an electrical input or a mechanical input may vary appreciably over a spatial extent of the electroactive device.

In some embodiments, the electroactive response may include an electrical signal having a characteristic indicative of a location of the mechanical input to the electroactive device, the electrical signal being measured between the primary electrode and the secondary electrode. The electrical signal may be a termed sensor signal, and in some embodiments, the electroactive device may be, or include, a sensor. In some embodiments, an electroactive device may be used as both an actuator and a sensor. In some embodiments, the electroactive device may be supported against a hand of a user, and the electrical signal may be used to determine a gesture by the user, such as a finger movement. In some embodiments, typing inputs by a user, e.g., into a virtual keyboard, may be determined from sensor signals.

According to some embodiments, the frequency of alternating voltage may be selected to provide an appreciable haptic sensation on the skin of a user. In some embodiments, the frequency may be higher than the highest mechanical response frequency of the device, so that deformation may occur in response to the applied RMS electric field but with no appreciable oscillatory mechanical response to the applied frequency. The applied electrical signal may generate non-uniform constriction of the electroactive polymer layer between the primary and secondary electrodes. A non-uniform electroactive response may include a curvature of a surface of the electroactive device, which may in some embodiments be a compound curvature.

In conjunction with the foregoing, a method of fabricating an electrode suitable for incorporation into an electroactive device such as a multilayer actuator or sensor may include forming an electrode precursor composition including conductive particles dispersed throughout a curable material, forming a layer of the electrode precursor composition over a substrate, and curing the curable material to form the electrode.

A method of fabricating an electroactive device may include forming an electrode precursor composition including conductive particles dispersed throughout a network of a first curable material, forming a polymer precursor composition including a second curable material, forming a layer of the electrode precursor composition immediately adjacent to a layer of the polymer precursor composition, and curing the first and second curable materials to form an electrode adjacent to a layer of an electroactive polymer.

While the multilayer architectures of the present disclosure are described generally in connection with mechanical actuators and sensors, these structures may be used in other fields. For example, the multilayer stacks with integrated electrodes may be used as part of, or in combination with passive and active optics, including a lens, mirror, holographic element, beam splitter, optical filter, optical retardation films, polarizers, compensators, reflective films, alignment layers, color filters, antistatic protection sheets, electromagnetic interference protection sheets, polarization-controlled lenses for autostereoscopic three-dimensional displays, and infrared reflection films, and the like.

An adjustable lens, for instance, may include any suitable type of lens with adjustable optical properties (e.g., adjustable optical power/focal length, correcting for wave-front distortion and/or aberrations, etc.), such as a liquid lens, a gel lens, or other adjustable lens.

For example, an adjustable lens may include a deformable exterior layer filled with an optical medium such as a liquid or a semi-solid material (e.g., a gel, a semi-solid polymer, etc.). An adjustable lens may include one or more substantially transparent materials (at wavelengths of application) that may deform and/or flow under pressure.

A deformable optical element may include a substantially transparent and elastic material. For example, a deformable optical element may include a natural or synthetic elastomer that returns to a resting state when a deforming force is removed. In some embodiments, a deformable optical element may be deformed using an electroactive device generating a directly-driven force to produce a desired optical power or other optical property, e.g., for a lens or other optical element. In some embodiments, actuation forces may be applied around a perimeter of a deformable lens and may be generally uniform or variable around the perimeter. In some embodiments, electroactive devices may be used to actuate deformable optical elements in optical assemblies (e.g., lens systems).

In some embodiments, a lens assembly may include multiple deformable optical elements (e.g., multiple deformable lenses, such as liquid lenses), where the deformation is provided by one or more multilayer electroactive devices, in accordance with example embodiments of the disclosure.

According to some embodiments, an optical element may include a tunable lens and an electroded layer of an electroactive polymer disposed over a first surface of the tunable lens. The tunable lens may be a liquid lens, for example, and may have a geometry selected from prismatic, freeform, plano, meniscus, bi-convex, plano-convex, bi-concave, or plano-concave, etc. In certain embodiments, a further optical element may be disposed over a second surface of the tunable lens. The optical element may be incorporated into a head mounted display, e.g., within a transparent aperture thereof.

In the presence of an electrostatic field (E-field), an electroactive polymer may deform (e.g., compress, elongate, bend, etc.) according to the magnitude and direction of the applied field. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

In accordance with various embodiments, liquid lenses can be used to enhance imaging system flexibility across a wide variety of applications that benefit from rapid focusing. According to certain embodiments, by integrating an actuatable liquid lens, an imaging system can rapidly change the plane of focus to provide a sharper image, independent of an object's distance from the camera. The use of liquid lenses may be particularly advantageous for applications that involve focusing at multiple distances, where objects under inspection may have different sizes or may be located at varying distances from the lens, such as package sorting, barcode reading, security, and rapid automation, in addition to virtual reality/augmented reality devices.

An electroactive device (e.g., an actuator or a sensor) may include a plurality of stacked layers. For example, an electroactive device may include multiple electroactive polymer layers each arranged between a pair of electrodes. For example, an electroactive device may include a stack of from two electroactive polymer layers and corresponding electrodes to thousands of electroactive polymer layers (e.g., approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive polymer layers, including ranges between any of the foregoing values). A large number of layers may be used to achieve a high displacement output, where the overall device displacement may be expressed as the sum of the displacement of each layer.

In some embodiments, an electrode may be shared between layers; for example, a device may have alternating electrodes and electroactive polymer layers located between neighboring pairs of electrodes. Various stacked configurations can be constructed in different geometries that alter the shape, alignment, and spacing between layers. Such complex arrangements can enable compression, extension, twisting, and/or bending when operating the electroactive device.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-24, a detailed description of methods and systems related to the manufacture of an extruded or printed multilayer with electrodes. The discussion associated with FIG. 1 includes a description of a comparative multilayer architecture at an intermediate stage of fabrication. The discussion associated with FIG. 2 includes a description of the effects of conductive particle loading on the electrical conductivity of a composite polymer-based thin film. The discussion associated with FIGS. 3-18 includes a description of various multilayer geometries, including multilayer architectures having electrode layers characterized by both interlayer and intralayer compositional gradients according to various embodiments. The discussion associated with FIGS. 19-24 relates to exemplary virtual reality and augmented reality devices that may include an optical element including an extruded or printed multilayer with electrodes.

Various example multilayer structures are illustrated in FIGS. 3-18. Referring initially to FIGS. 3-6, shown at an intermediate stage of fabrication are planar architectures that include alternating layers of an electrode precursor composition and a polymer precursor composition. FIG. 3 is a schematic illustration of an example tri-layer architecture 300 prior to curing. Tri-layer structure 300 includes a first polymer precursor layer 310, an electrode precursor layer 320 overlying the first polymer precursor layer 310, and a second polymer precursor layer 330 overlying the electrode precursor layer 320. FIG. 4 is a schematic illustration of a further example tri-layer architecture 400 prior to curing. Tri-layer structure 400 includes a first electrode precursor layer 420, a polymer precursor layer 410 overlying the first electrode precursor layer 420, and a second electrode precursor layer 440 overlying the polymer precursor layer 410.

Additional example multilayer structures are shown in FIGS. 5 and 6. In FIG. 5, the multilayer structure 500 includes, from bottom to top, a first electrode precursor layer 520, a first polymer precursor layer 510, a second electrode precursor layer 540, a second polymer precursor layer 530, a third electrode precursor layer 560, a third polymer precursor layer 550, and a fourth electrode precursor layer 580. As in FIG. 6, a multilayer layer structure may include layers of different thickness. In the illustrated embodiment, multilayer structure 600 includes from bottom to top, a first electrode precursor layer 620, a first polymer precursor layer 610, a second electrode precursor layer 640, a second polymer precursor layer 630, a third electrode precursor layer 660, a third polymer precursor layer 650, and a fourth electrode precursor layer 680, where the third electrode precursor layer 660 is thicker than the first, second, or fourth electrode precursor layers 620, 640, 680 and the first polymer precursor layer 610 is thicker than the second or third polymer precursor layers 630, 650. As disclosed herein, the various layers within the exemplary multilayer structures may be co-extruded.

Figure 7:
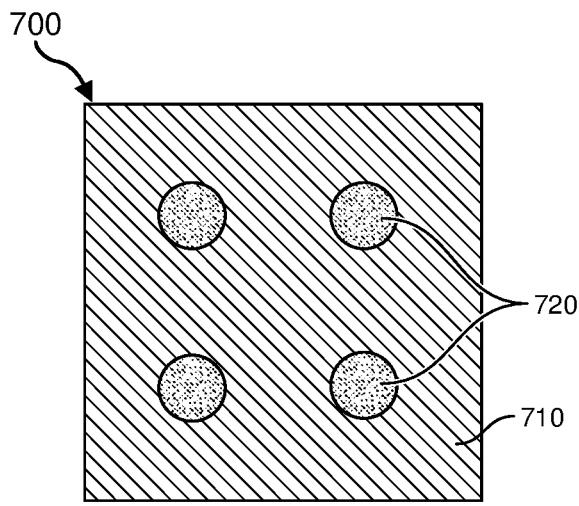
FIG. 7 shows a cross-sectional view of an example rod-shaped structure having a regular array of conductive regions disposed within an insulating polymer matrix according to some embodiments.
Figure 8:
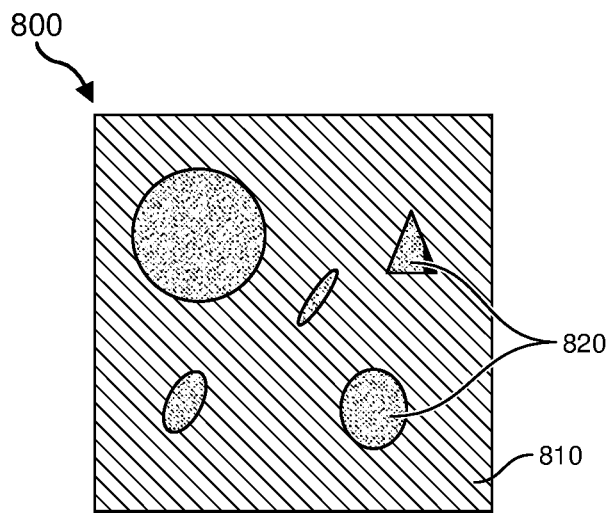
FIG. 8 depicts a cross-sectional view of an example rod-shaped structure having an irregular array of conductive regions disposed within an insulating polymer matrix according to certain embodiments.
Figure 9:
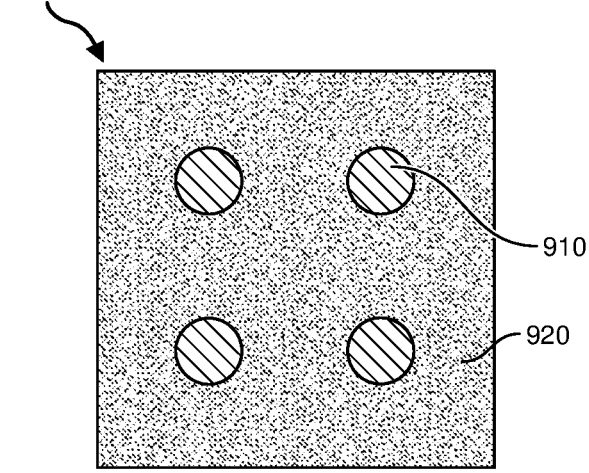
FIG. 9 shows a cross-sectional view of an example rod-shaped structure having a regular array of insulating polymer regions disposed within a conductive matrix according to some embodiments.

As an alternative to the planar architectures of FIGS. 3-6, according to further embodiments, multilayer structures may be formed having a three-dimensional, e.g., rod-shaped geometry. FIG. 7, for example, shows a cross-sectional view of an example rod-shaped structure 700 including an insulating polymer matrix 710 having a regular array of conductive regions 720 disposed within the polymer matrix 710. FIG. 8 depicts a cross-sectional view of an example rod-shaped structure 800 having an irregular array of conductive regions 820 disposed within an insulating polymer matrix 810. FIG. 9 shows a cross-sectional view of an example rod-shaped structure 900 having a regular array of insulating polymer regions 910 disposed within a conductive matrix 920.

Figure 10:
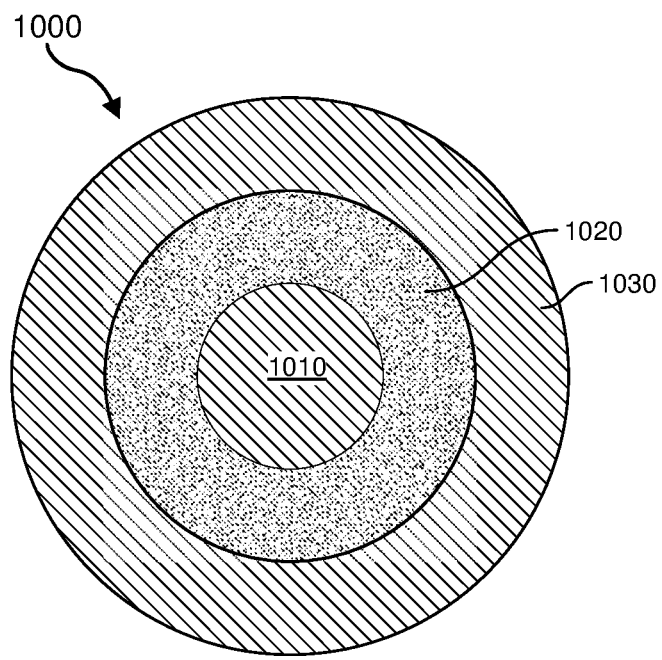
FIG. 10 is a schematic illustration of an extruded fiber having an insulating core and an insulating shell encasing an annular conductive layer according to various embodiments.
Figure 11:
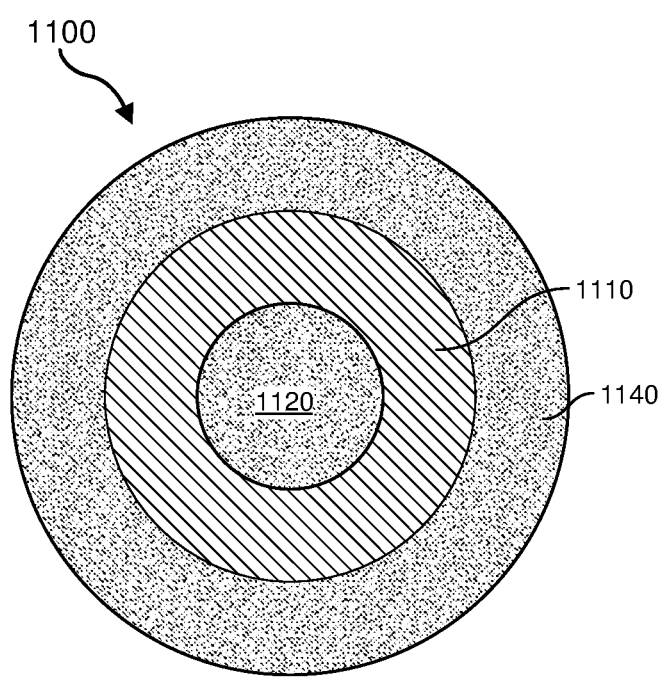
FIG. 11 is a schematic illustration of an extruded fiber having a conductive core and a conductive shell encasing an annular insulating layer according to various embodiments.
Figure 12:
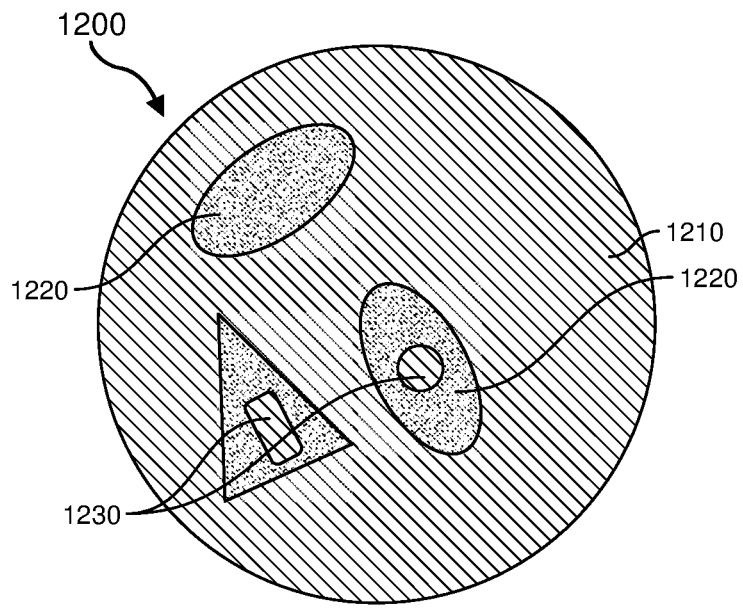
FIG. 12 is a schematic illustration of an extruded fiber having an insulating shell encasing a plurality of conductive regions according to further embodiments.

According to still further embodiments, FIG. 10 is a schematic illustration of an extruded fiber 1000 having an insulating polymer core 1010 and an insulating shell 1030 encasing an annular conductive layer 1020 according to various embodiments. FIG. 11 is a schematic illustration of a further extruded fiber 1100 having a conductive core 1120 and a conductive shell 1140 encasing an annular insulating layer 1110 according to various embodiments. FIG. 12 is a schematic illustration of an extruded fiber 1200 having an insulating polymer shell 1210 encasing a plurality of conductive regions 1220. Conductive regions 1220 may further include one or more embedded polymer regions 1230. As shown in FIGS. 10-12, embedded regions may be regularly or irregularly arranged within a host matrix and may have equal or unequal shapes and sizes.

Figure 13:
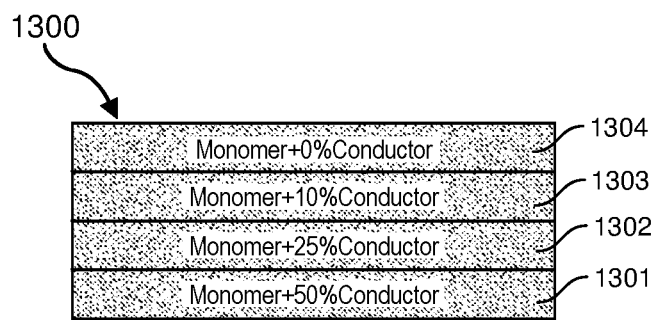
FIG. 13 shows a multilayer composite architecture having a variable interlayer conductor content according to some embodiments.
Figure 14:
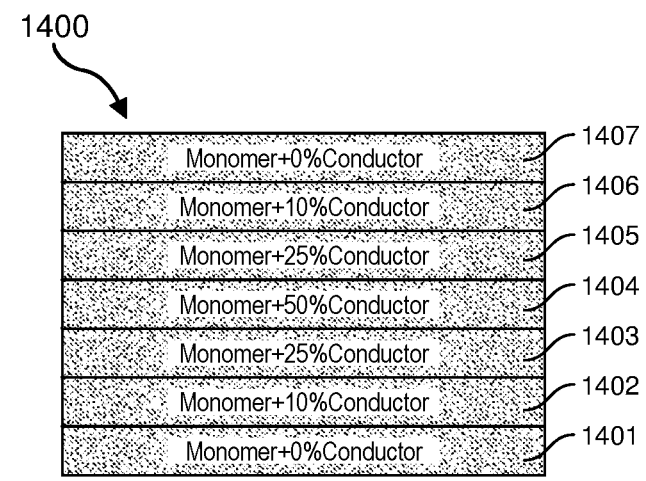
FIG. 14 shows a multilayer composite architecture having a variable and symmetric interlayer conductor content according to some embodiments.

According to some embodiments, extruded multilayers may include a uniform or non-uniform distribution of conductive particles within one or more layers thereof. Referring to FIG. 13, for example, multilayer structure 1300 may include plural sub-layers 1301, 1302, 1303, 1304 each having a different concentration of conductive particles. Such sub-layers may be stacked to sequentially increase (or decrease) the conductive particle content across the multilayer structure 1300. Referring to FIG. 14, according to further embodiments, plural sub-layers may be stacked to initially increase (decrease) and then decrease (increase) the conductive particle content throughout a multilayer. Multilayer structure 1400 may include plural sub-layers 1401, 1402, 1403, 1404, 1405, 1406, 1407 that may each independently have a conductive particle content ranging from approximately 0 vol. % to approximately 99 vol. %.

Figure 15:
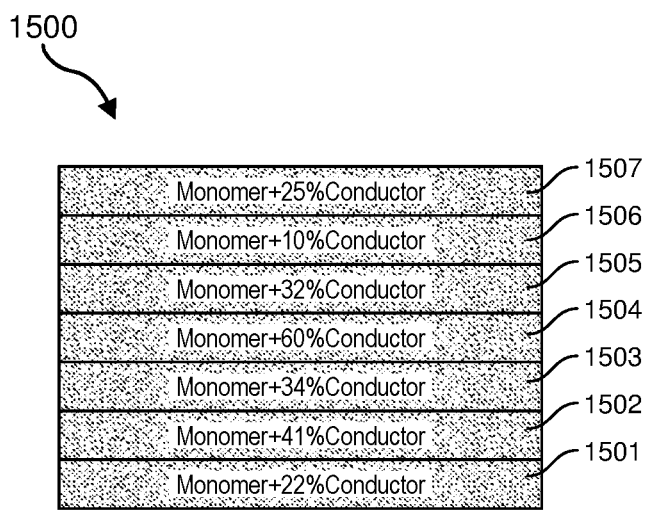
FIG. 15 is a schematic illustration of a further multilayer composite architecture having a variable and asymmetric interlayer conductor content according to some embodiments.

FIG. 15 is a schematic illustration of a further multilayer composite architecture having a variable and asymmetric interlayer conductor content according to some embodiments. Multilayer structure 1500 may include stacked sub-layers 1501, 1502, 1503, 1504, 1505, 1506, 1507 having a stochastic interlayer distribution of conductive particles.

Figure 16:
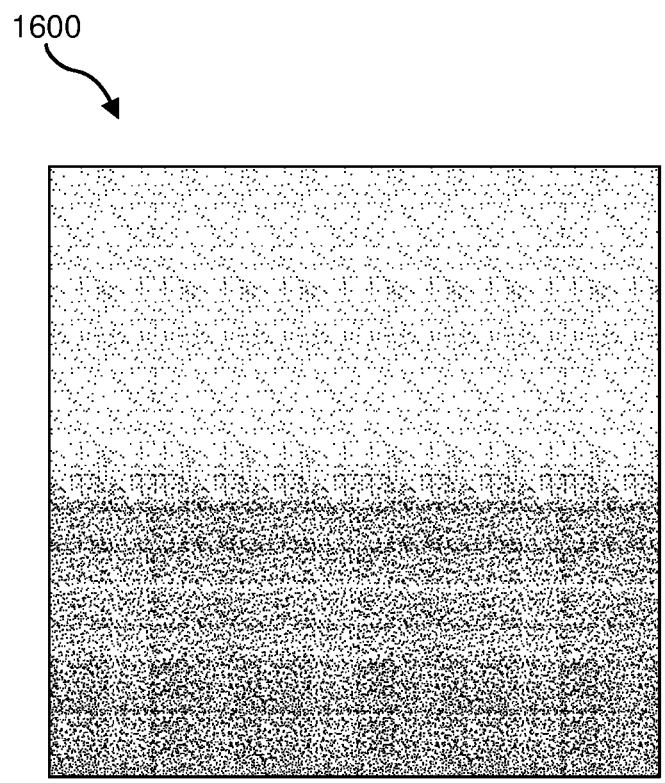
FIG. 16 depicts an extruded composite layer having a through-thickness gradient in the concentration of conductive particles according to various embodiments.
Figure 17:
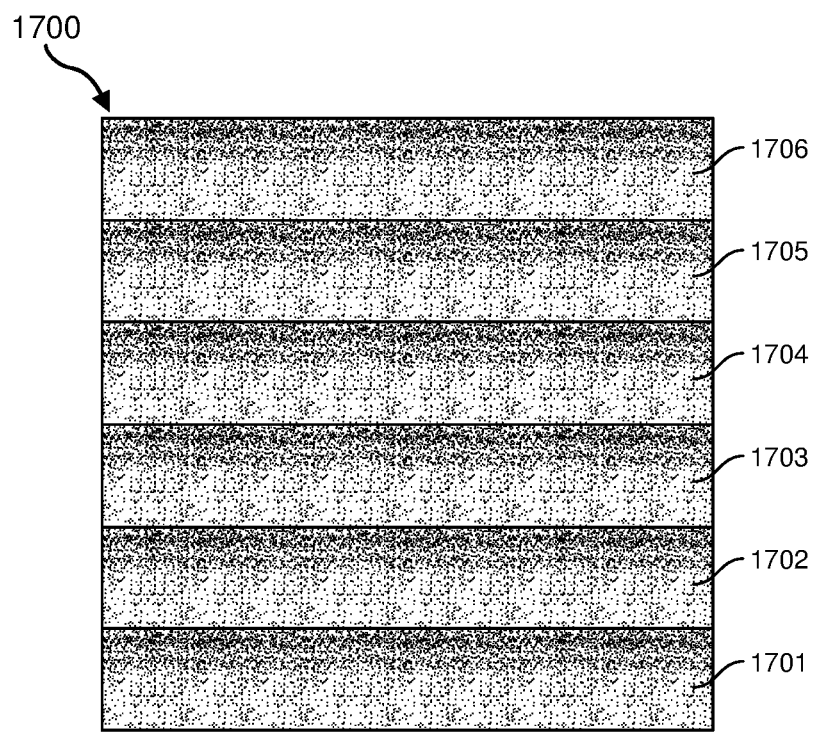
FIG. 17 depicts a multilayer composite structure having an intralayer gradient in the conductive particle content according to various embodiments.
Figure 18:
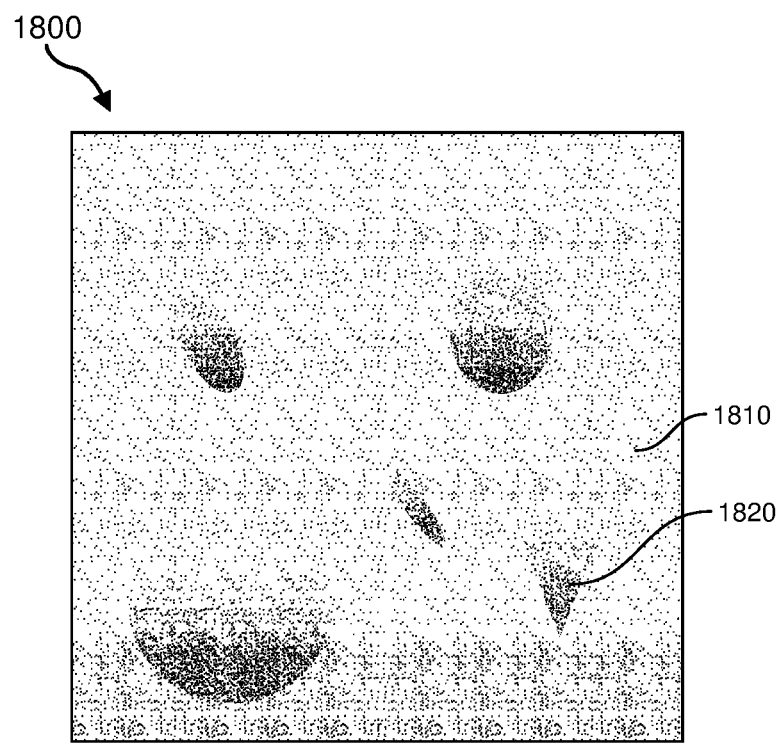
FIG. 18 shows an extruded composite layer including an insulating polymer matrix and embedded conductive regions each having a gradient in the conductive particle content according to certain embodiments.

In some embodiments, an extruded or printed layer may exhibit an intralayer gradient in conductive particles. Such a structure may be achieved by allowing conductive particles within a deposited layer of an electrode precursor composition to at least partially settle prior to curing. For example, FIG. 16 depicts an extruded layer 1600 having a through-thickness gradient in the concentration of conductive particles. FIG. 17 depicts a multilayer composite structure 1700 including plural stacked sub-layers 1701, 1702, 1703, 1704, 1705, 1706 each having an intralayer gradient in the conductive particle content. FIG. 18 shows an extruded composite layer including an insulating polymer matrix 1810 and embedded conductive regions 1820 each having a gradient in the conductive particle content.

As disclosed herein, multilayer structures such as actuators may include a layer of active material (e.g., a polymer or ceramic layer) disposed between conductive electrodes. Various embodiments of the instant disclosure describe the co-integration of manufacturing methods used to form the respective layers of the multilayer structure. More specifically, the disclosure relates to compositions and methods for forming the conductive electrodes in a manner compatible with processing of the active (electroactive) layers. Example manufacturing methods include inkjet printing and extrusion.

Particular embodiments relate to fluid compositions that include conductive particles dispersed in a polymerizable monomer. Example particle/monomer dispersions may further include a surfactant and may exhibit rheological properties suitable for printing or extrusion. Moreover, the fluid compositions may avoid the use of liquid solvents and thus obviate large volume changes during drying. The concentration of conductive particles may be chosen to achieve a percolation threshold for the electrode layers. Example fluid compositions may include at least 10 vol. % conductive particles. The conductive particles may be nanoscale particles (d<100 nm) and may include carbon (e.g., graphene, graphene oxide, graphite, and the like), conductive oxides (e.g., TCOs), and metals such as gold, silver, palladium, platinum, etc. Example polymerizable or crosslinkable molecules include acrylates, vinyls, isocyanates, epoxies, thiols, silanes, urethanes, silicones, siliconacrylates, thiolacrylates, and the like. The fluid compositions may be printed or extruded in various geometries, including linear (fibrous), planar, or other complex shapes. Properties of an electrode, including the conductivity, may be tailored by varying the composition and/or geometry of the deposited fluid.

EXAMPLE EMBODIMENTS

Example 1: A mixture includes at least 10 volume percent conductive particles dispersed within a network of a curable material, where the mixture has a viscosity of less than approximately 100 Poise and the conductive particles have an average particle size of less than approximately 100 nm.

Example 2: The mixture of Example 1, where the conductive particles include at least one material selected from graphite, graphene, graphene oxide, gold nanoparticles, silver nanoparticles, palladium nanoparticles, platinum nanoparticles, transparent conductive oxides, carbon nanotubes, carbon black, poly(3,4-ethylenedioxythiophene), and polystyrene sulfonate.

Example 3: The mixture of any of Examples 1 and 2, where the conductive particles include a modified surface.

Example 4: The mixture of any of Examples 1-3, where the curable material include at least one material selected from acrylates, silicones, silicone acrylates, thiols, thiol acrylates, silanes, vinyls, isocyanates, epoxies, and urethanes.

Example 5: The mixture of any of Examples 1-4, further including a polymerizable surfactant.

Example 6: The mixture of any of Examples 1-4, further including a non-polymerizable surfactant.

Example 7: The mixture of any of Examples 1-4, further including a surfactant selected from an epoxy monomer, an epoxy acrylate, a polyimide, a mono(meth)acrylate, a di(meth)acrylate, an ethylene oxide-modified diol, and an ethylene oxide-modified acrylate.

Example 8: The mixture of any of Examples 1-7, where the mixture is free of a liquid solvent.

Example 9: A method includes (a) forming an electrode precursor composition having conductive particles dispersed throughout a network of a curable material, (b) forming a layer of the electrode precursor composition on a substrate, and (c) curing the curable material to form an electrode.

Example 10: The method of Example 9, where the electrode precursor composition includes at least 10 volume percent conductive particles.

Example 11: The method of any of Examples 9 and 10, where the conductive particles have an average particle size of less than approximately 100 nm.

Example 12: The method of any of Examples 9-11, where the electrode precursor composition prior to the act of curing has a viscosity of less than approximately 100 Poise.

Example 13: The method of any of Examples 9-12, where the curable material includes at least one material selected from acrylates, silicones, silicone acrylates, thiols, thiol acrylates, silanes, vinyls, isocyanates, epoxies, and urethanes.

Example 14: The method of any of Examples 9-13, where the electrode precursor composition further includes a surfactant.

Example 15: The method of any of Examples 9-14, further including forming a polymer precursor composition including a second curable material and forming a layer of the polymer precursor composition in contact with the layer of the electrode precursor composition.

Example 16: The method of Example 15, where forming the layer of the electrode precursor composition and forming the layer of the polymer precursor composition are performed simultaneously.

Example 17: A method includes forming an electrode precursor composition comprising conductive particles dispersed throughout a network of a first curable material, forming a polymer precursor composition comprising a second curable material, forming a layer of the electrode precursor composition immediately adjacent to a layer of the polymer precursor composition, and curing the first and second curable materials to form a multilayer structure.

Example 18: The method of Example 17, where the layer of the electrode precursor composition and the layer of the polymer precursor composition are formed simultaneously.

Example 19: The method of any of Examples 17 and 18, where the first curable material is different than the second curable material.

Example 20: The method of any of Examples 17-19, where the electrode precursor composition includes at least 10 volume percent conductive particles.

Embodiments of the present disclosure may include or be implemented in conjunction with various types of artificial-reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs), an example of which is augmented-reality system 1900 in FIG. 19. Other artificial-reality systems may include an NED that also provides visibility into the real world (e.g., augmented-reality system 2000 in FIG. 20) or that visually immerses a user in an artificial reality (e.g., virtual-reality system 2100 in FIG. 21). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 19:
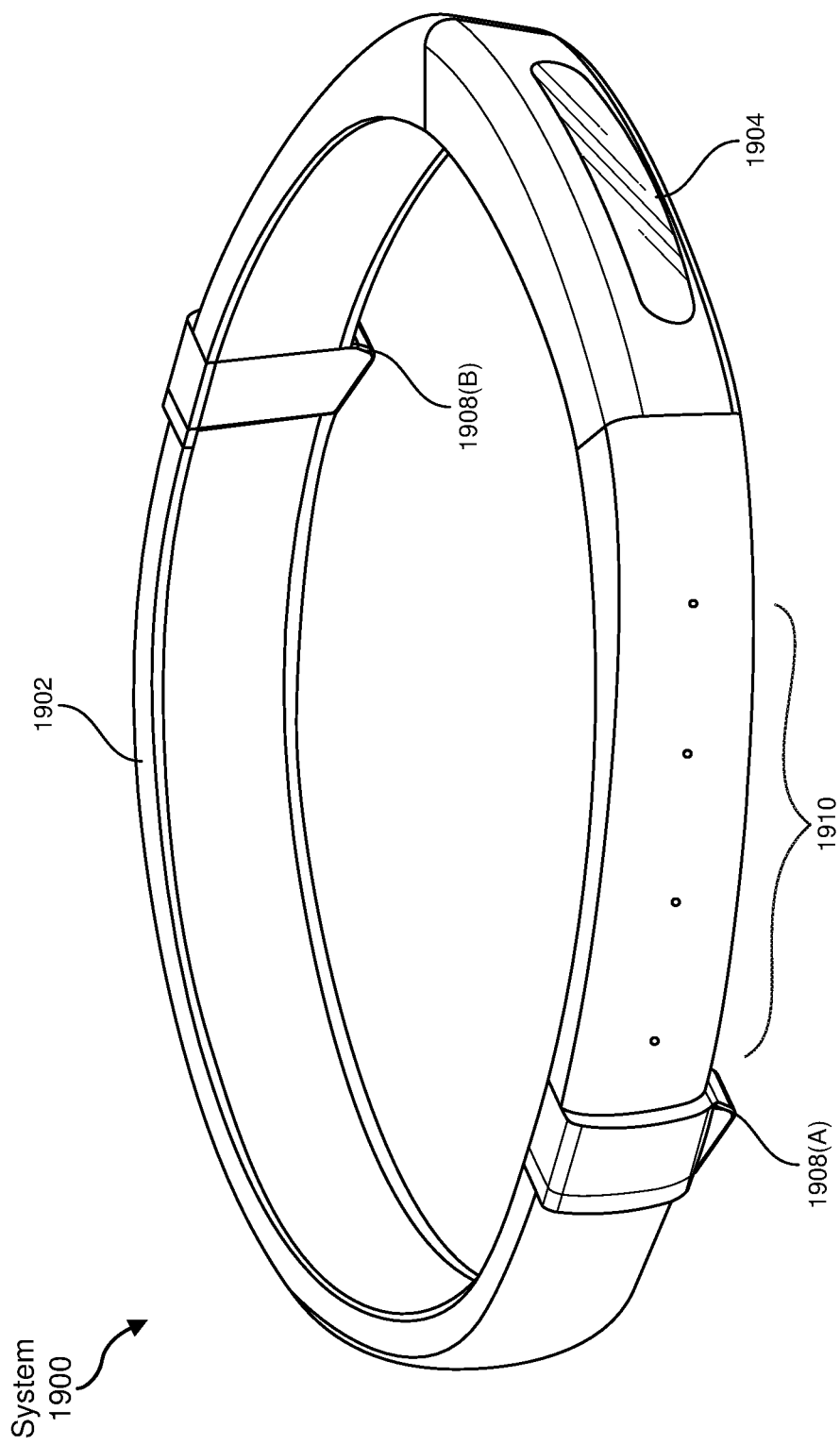
FIG. 19 is an illustration of an exemplary artificial-reality headband that may be used in connection with embodiments of this disclosure.

Turning to FIG. 19, augmented-reality system 1900 generally represents a wearable device dimensioned to fit about a body part (e.g., a head) of a user. As shown in FIG. 19, system 1900 may include a frame 1902 and a camera assembly 1904 that is coupled to frame 1902 and configured to gather information about a local environment by observing the local environment. Augmented-reality system 1900 may also include one or more audio devices, such as output audio transducers 1908(A) and 1908(B) and input audio transducers 1910. Output audio transducers 1908(A) and 1908(B) may provide audio feedback and/or content to a user, and input audio transducers 1910 may capture audio in a user's environment.

As shown, augmented-reality system 1900 may not necessarily include an NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 1900 may not include an NED, augmented-reality system 1900 may include other types of screens or visual feedback devices (e.g., a display screen integrated into a side of frame 1902).

Figure 20:
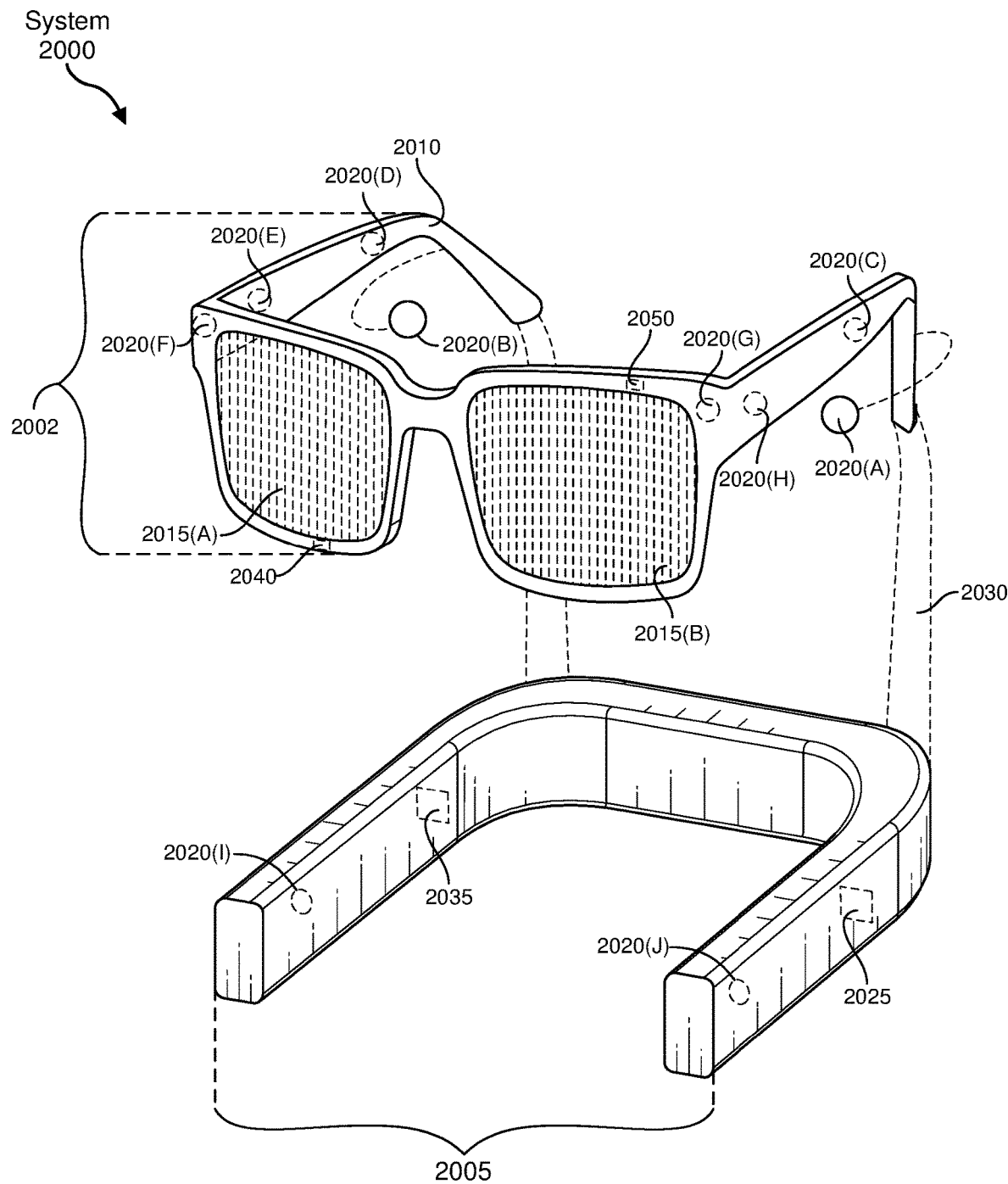
FIG. 20 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 20, augmented-reality system 2000 may include an eyewear device 2002 with a frame 2010 configured to hold a left display device 2015(A) and a right display device 2015(B) in front of a user's eyes. Display devices 2015(A) and 2015(B) may act together or independently to present an image or series of images to a user. While augmented-reality system 2000 includes two displays, embodiments of this disclosure may be implemented in augmented-reality systems with a single NED or more than two NEDs.

In some embodiments, augmented-reality system 2000 may include one or more sensors, such as sensor 2040. Sensor 2040 may generate measurement signals in response to motion of augmented-reality system 2000 and may be located on substantially any portion of frame 2010. Sensor 2040 may represent a position sensor, an inertial measurement unit (IMU), a depth camera assembly, or any combination thereof. In some embodiments, augmented-reality system 2000 may or may not include sensor 2040 or may include more than one sensor. In embodiments in which sensor 2040 includes an IMU, the IMU may generate calibration data based on measurement signals from sensor 2040. Examples of sensor 2040 may include, without limitation, accelerometers, gyroscopes, magnetometers, other suitable types of sensors that detect motion, sensors used for error correction of the IMU, or some combination thereof.

Augmented-reality system 2000 may also include a microphone array with a plurality of acoustic transducers 2020(A)-2020(J), referred to collectively as acoustic transducers 2020. Acoustic transducers 2020 may be transducers that detect air pressure variations induced by sound waves. Each acoustic transducer 2020 may be configured to detect sound and convert the detected sound into an electronic format (e.g., an analog or digital format). The microphone array in FIG. 2 may include, for example, ten acoustic transducers: 2020(A) and 2020(B), which may be designed to be placed inside a corresponding ear of the user, acoustic transducers 2020(C), 2020(D), 2020(E), 2020(F), 2020(G), and 2020(H), which may be positioned at various locations on frame 2010, and/or acoustic transducers 2020(I) and 2020(J), which may be positioned on a corresponding neckband 2005.

In some embodiments, one or more of acoustic transducers 2020(A)-(F) may be used as output transducers (e.g., speakers). For example, acoustic transducers 2020(A) and/or 2020(B) may be earbuds or any other suitable type of headphone or speaker.

The configuration of acoustic transducers 2020 of the microphone array may vary. While augmented-reality system 2000 is shown in FIG. 20 as having ten acoustic transducers 2020, the number of acoustic transducers 2020 may be greater or less than ten. In some embodiments, using higher numbers of acoustic transducers 2020 may increase the amount of audio information collected and/or the sensitivity and accuracy of the audio information. In contrast, using a lower number of acoustic transducers 2020 may decrease the computing power required by an associated controller 2050 to process the collected audio information. In addition, the position of each acoustic transducer 2020 of the microphone array may vary. For example, the position of an acoustic transducer 2020 may include a defined position on the user, a defined coordinate on frame 2010, an orientation associated with each acoustic transducer 2020, or some combination thereof.

Acoustic transducers 2020(A) and 2020(B) may be positioned on different parts of the user's ear, such as behind the pinna or within the auricle or fossa. Or, there may be additional acoustic transducers 2020 on or surrounding the ear in addition to acoustic transducers 2020 inside the ear canal. Having an acoustic transducer 2020 positioned next to an ear canal of a user may enable the microphone array to collect information on how sounds arrive at the ear canal. By positioning at least two of acoustic transducers 2020 on either side of a user's head (e.g., as binaural microphones), augmented-reality device 2000 may simulate binaural hearing and capture a 3D stereo sound field around about a user's head. In some embodiments, acoustic transducers 2020(A) and 2020(B) may be connected to augmented-reality system 2000 via a wired connection 2030, and in other embodiments, acoustic transducers 2020(A) and 2020(B) may be connected to augmented-reality system 2000 via a wireless connection (e.g., a Bluetooth connection). In still other embodiments, acoustic transducers 2020(A) and 2020(B) may not be used at all in conjunction with augmented-reality system 2000.

Acoustic transducers 2020 on frame 2010 may be positioned along the length of the temples, across the bridge, above or below display devices 2015(A) and 2015(B), or some combination thereof. Acoustic transducers 2020 may be oriented such that the microphone array is able to detect sounds in a wide range of directions surrounding the user wearing the augmented-reality system 2000. In some embodiments, an optimization process may be performed during manufacturing of augmented-reality system 2000 to determine relative positioning of each acoustic transducer 2020 in the microphone array.

In some examples, augmented-reality system 2000 may include or be connected to an external device (e.g., a paired device), such as neckband 2005. Neckband 2005 generally represents any type or form of paired device. Thus, the following discussion of neckband 2005 may also apply to various other paired devices, such as charging cases, smart watches, smart phones, wrist bands, other wearable devices, hand-held controllers, tablet computers, laptop computers and other external compute devices, etc.

As shown, neckband 2005 may be coupled to eyewear device 2002 via one or more connectors. The connectors may be wired or wireless and may include electrical and/or non-electrical (e.g., structural) components. In some cases, eyewear device 2002 and neckband 2005 may operate independently without any wired or wireless connection between them. While FIG. 20 illustrates the components of eyewear device 2002 and neckband 2005 in example locations on eyewear device 2002 and neckband 2005, the components may be located elsewhere and/or distributed differently on eyewear device 2002 and/or neckband 2005. In some embodiments, the components of eyewear device 2002 and neckband 2005 may be located on one or more additional peripheral devices paired with eyewear device 2002, neckband 2005, or some combination thereof.

Pairing external devices, such as neckband 2005, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 2000 may be provided by a paired device or shared between a paired device and an eyewear device, thus reducing the weight, heat profile, and form factor of the eyewear device overall while still retaining desired functionality. For example, neckband 2005 may allow components that would otherwise be included on an eyewear device to be included in neckband 2005 since users may tolerate a heavier weight load on their shoulders than they would tolerate on their heads. Neckband 2005 may also have a larger surface area over which to diffuse and disperse heat to the ambient environment. Thus, neckband 2005 may allow for greater battery and computation capacity than might otherwise have been possible on a stand-alone eyewear device. Since weight carried in neckband 2005 may be less invasive to a user than weight carried in eyewear device 2002, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 2005 may be communicatively coupled with eyewear device 2002 and/or to other devices. These other devices may provide certain functions (e.g., tracking, localizing, depth mapping, processing, storage, etc.) to augmented-reality system 2000. In the embodiment of FIG. 20, neckband 2005 may include two acoustic transducers (e.g., 2020(I) and 2020(J)) that are part of the microphone array (or potentially form their own microphone subarray). Neckband 2005 may also include a controller 2025 and a power source 2035.

Acoustic transducers 2020(I) and 2020(J) of neckband 2005 may be configured to detect sound and convert the detected sound into an electronic format (analog or digital). In the embodiment of FIG. 20, acoustic transducers 2020(I) and 2020(J) may be positioned on neckband 2005, thereby increasing the distance between the neckband acoustic transducers 2020(I) and 2020(J) and other acoustic transducers 2020 positioned on eyewear device 2002. In some cases, increasing the distance between acoustic transducers 2020 of the microphone array may improve the accuracy of beam-forming performed via the microphone array. For example, if a sound is detected by acoustic transducers 2020(C) and 2020(D) and the distance between acoustic transducers 2020(C) and 2020(D) is greater than, e.g., the distance between acoustic transducers 2020(D) and 2020(E), the determined source location of the detected sound may be more accurate than if the sound had been detected by acoustic transducers 2020(D) and 2020(E).

Controller 2025 of neckband 2005 may process information generated by the sensors on neckband 2005 and/or augmented-reality system 2000. For example, controller 2025 may process information from the microphone array that describes sounds detected by the microphone array. For each detected sound, controller 2025 may perform a direction-of-arrival (DOA) estimation to estimate a direction from which the detected sound arrived at the microphone array. As the microphone array detects sounds, controller 2025 may populate an audio data set with the information. In embodiments in which augmented-reality system 2000 includes an inertial measurement unit, controller 2025 may compute all inertial and spatial calculations from the IMU located on eyewear device 2002. A connector may convey information between augmented-reality system 2000 and neckband 2005 and between augmented-reality system 2000 and controller 2025. The information may be in the form of optical data, electrical data, wireless data, or any other transmittable data form. Moving the processing of information generated by augmented-reality system 2000 to neckband 2005 may reduce weight and heat in eyewear device 2002, making it more comfortable to the user.

Power source 2035 in neckband 2005 may provide power to eyewear device 2002 and/or to neckband 2005. Power source 2035 may include, without limitation, lithium ion batteries, lithium-polymer batteries, primary lithium batteries, alkaline batteries, or any other form of power storage. In some cases, power source 2035 may be a wired power source. Including power source 2035 on neckband 2005 instead of on eyewear device 2002 may help better distribute the weight and heat generated by power source 2035.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 2100 in FIG. 21, that mostly or completely covers a user's field of view. Virtual-reality system 2100 may include a front rigid body 2102 and a band 2104 shaped to fit around a user's head. Virtual-reality system 2100 may also include output audio transducers 2106(A) and 2106(B). Furthermore, while not shown in FIG. 21, front rigid body 2102 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in augmented-reality system 2000 and/or virtual-reality system 2100 may include one or more liquid crystal displays (LCDs), light emitting diode (LED) displays, organic LED (OLED) displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial-reality systems may include one or more projection systems. For example, display devices in augmented-reality system 2000 and/or virtual-reality system 2100 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. Artificial-reality systems may also be configured with any other suitable type or form of image projection system.

Artificial-reality systems may also include various types of computer vision components and subsystems. For example, augmented-reality system 1900, augmented-reality system 2000, and/or virtual-reality system 2100 may include one or more optical sensors, such as two-dimensional (2D) or 3D cameras, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIGS. 19 and 21, output audio transducers 1908(A), 1908(B), 2106(A), and 2106(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1910 may include condenser microphones, dynamic microphones, ribbon microphones, and/or any other type or form of input transducer. In some embodiments, a single transducer may be used for both audio input and audio output.

Figure 21:
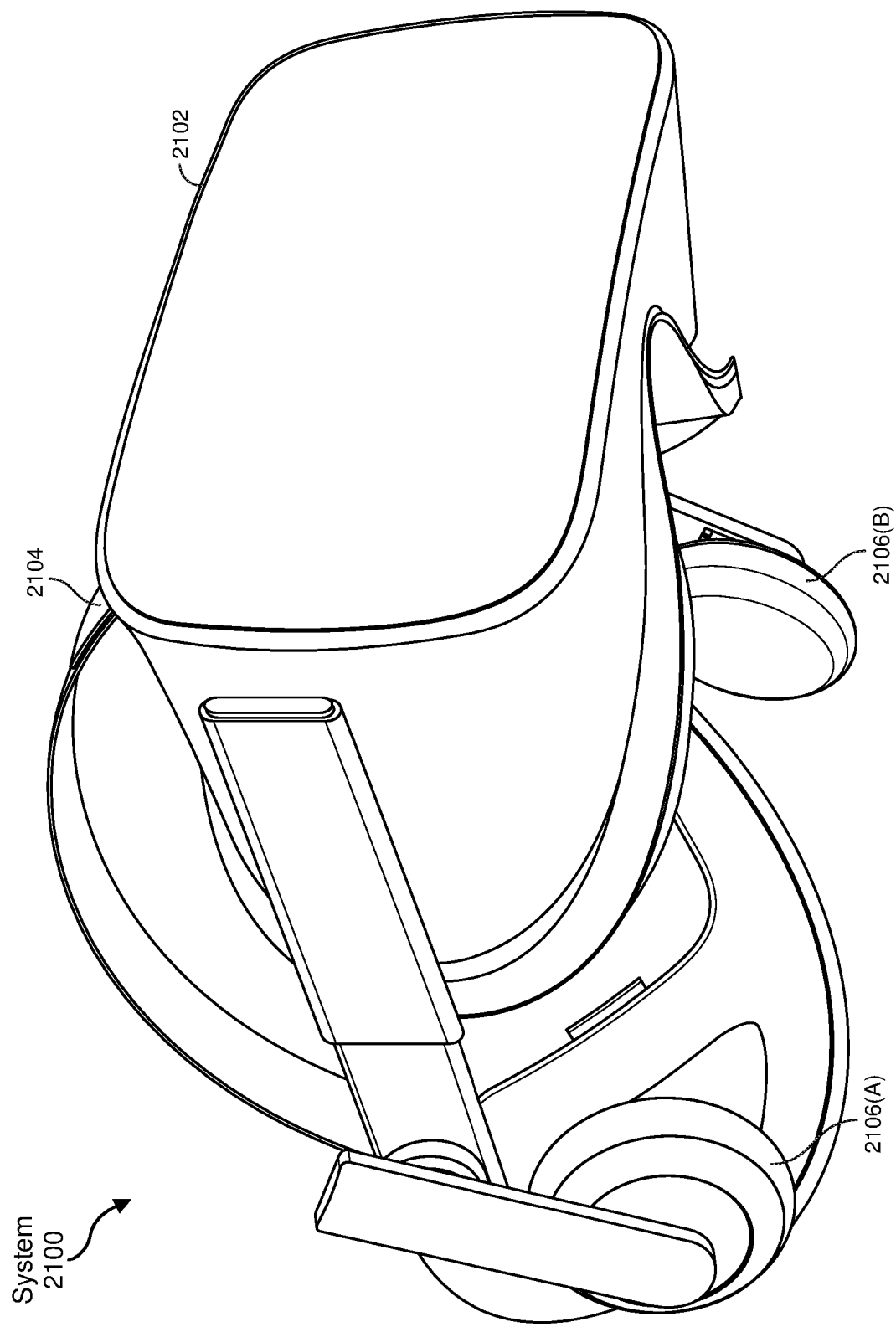
FIG. 21 is an illustration of an exemplary virtual-reality headset that may be used in connection with embodiments of this disclosure.

While not shown in FIGS. 19-21, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial-reality experience in one or more of these contexts and environments and/or in other contexts and environments.

As noted, artificial-reality systems 1900, 2000, and 2100 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 22:
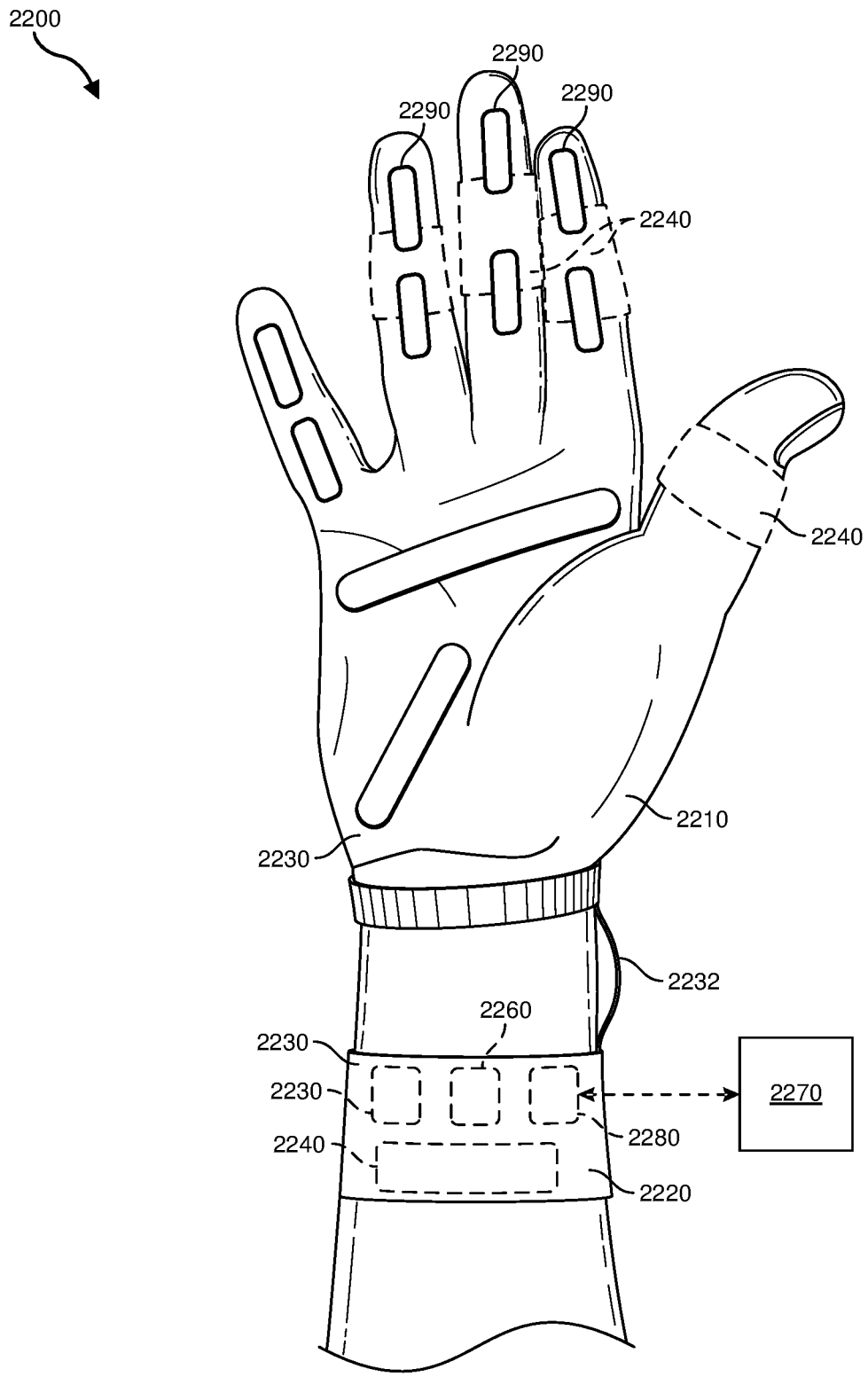
FIG. 22 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 22 illustrates a vibrotactile system 2200 in the form of a wearable glove (haptic device 2210) and wristband (haptic device 2220). Haptic device 2210 and haptic device 2220 are shown as examples of wearable devices that include a flexible, wearable textile material 2230 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 2240 may be positioned at least partially within one or more corresponding pockets formed in textile material 2230 of vibrotactile system 2200. Vibrotactile devices 2240 may be positioned in locations to provide a vibrating sensation (e.g., haptic feedback) to a user of vibrotactile system 2200. For example, vibrotactile devices 2240 may be positioned to be against the user's finger(s), thumb, or wrist, as shown in FIG. 22. Vibrotactile devices 2240 may, in some examples, be sufficiently flexible to conform to or bend with the user's corresponding body part(s).

A power source 2250 (e.g., a battery) for applying a voltage to the vibrotactile devices 2240 for activation thereof may be electrically coupled to vibrotactile devices 2240, such as via conductive wiring 2252. In some examples, each of vibrotactile devices 2240 may be independently electrically coupled to power source 2250 for individual activation. In some embodiments, a processor 2260 may be operatively coupled to power source 2250 and configured (e.g., programmed) to control activation of vibrotactile devices 2240.

Vibrotactile system 2200 may be implemented in a variety of ways. In some examples, vibrotactile system 2200 may be a standalone system with integral subsystems and components for operation independent of other devices and systems. As another example, vibrotactile system 2200 may be configured for interaction with another device or system 2270. For example, vibrotactile system 2200 may, in some examples, include a communications interface 2280 for receiving and/or sending signals to the other device or system 2270. The other device or system 2270 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 2280 may enable communications between vibrotactile system 2200 and the other device or system 2270 via a wireless (e.g., Wi-Fi, Bluetooth, cellular, radio, etc.) link or a wired link. If present, communications interface 2280 may be in communication with processor 2260, such as to provide a signal to processor 2260 to activate or deactivate one or more of the vibrotactile devices 2240.

Vibrotactile system 2200 may optionally include other subsystems and components, such as touch-sensitive pads 2290, pressure sensors, motion sensors, position sensors, lighting elements, and/or user interface elements (e.g., an on/off button, a vibration control element, etc.). During use, vibrotactile devices 2240 may be configured to be activated for a variety of different reasons, such as in response to the user's interaction with user interface elements, a signal from the motion or position sensors, a signal from the touch-sensitive pads 2290, a signal from the pressure sensors, a signal from the other device or system 2270, etc.

Although power source 2250, processor 2260, and communications interface 2280 are illustrated in FIG. 22 as being positioned in haptic device 2220, the present disclosure is not so limited. For example, one or more of power source 2250, processor 2260, or communications interface 2280 may be positioned within haptic device 2210 or within another wearable textile.

Figure 23:
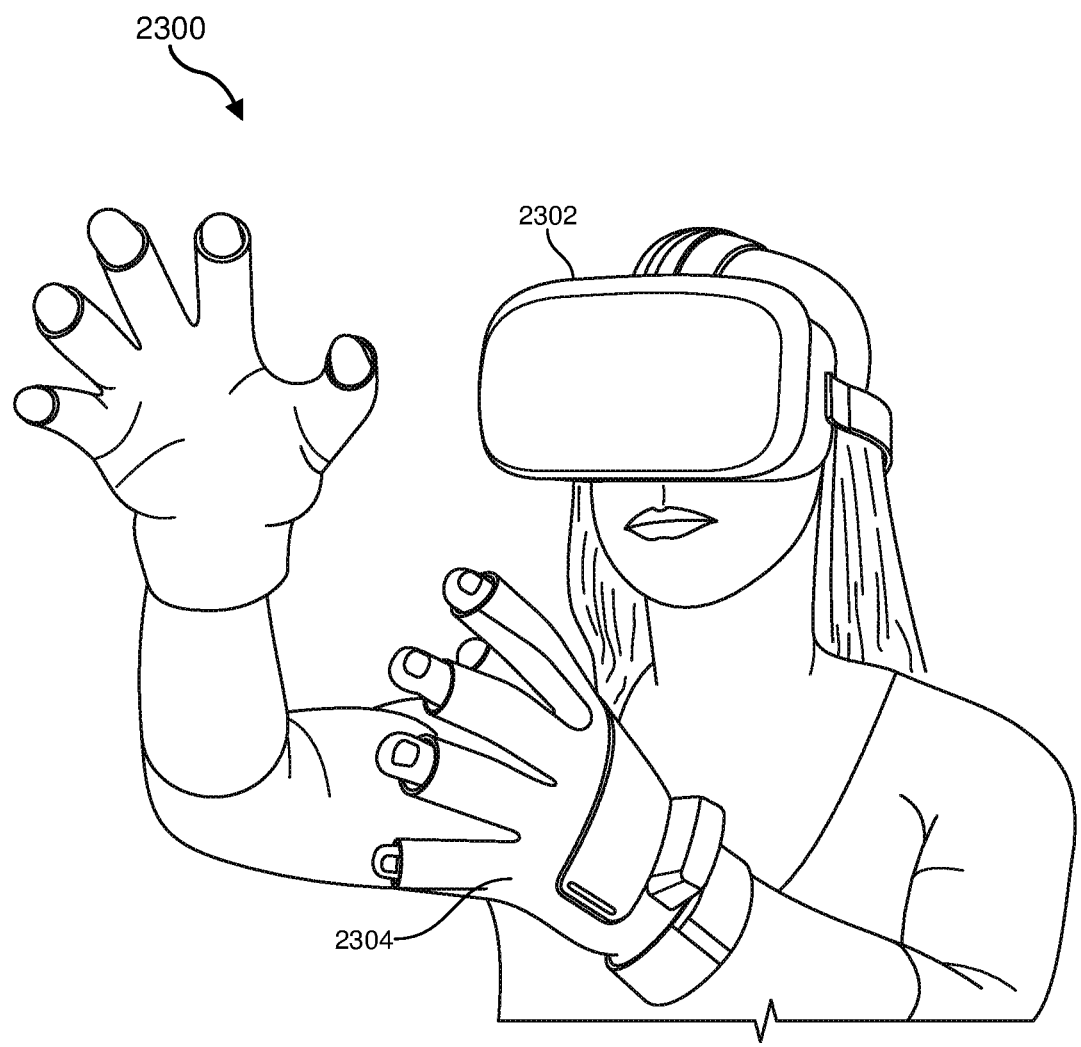
FIG. 23 is an illustration of an exemplary virtual-reality environment according to embodiments of this disclosure.

Haptic wearables, such as those shown in and described in connection with FIG. 22, may be implemented in a variety of types of artificial-reality systems and environments. FIG. 23 shows an example artificial-reality environment 2300 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Head-mounted display 2302 generally represents any type or form of virtual-reality system, such as virtual-reality system 2100 in FIG. 21. Haptic device 2304 generally represents any type or form of wearable device, worn by a use of an artificial-reality system, that provides haptic feedback to the user to give the user the perception that he or she is physically engaging with a virtual object. In some embodiments, haptic device 2304 may provide haptic feedback by applying vibration, motion, and/or force to the user. For example, haptic device 2304 may limit or augment a user's movement. To give a specific example, haptic device 2304 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 2304 to send action requests to a console. Examples of action requests include, without limitation, requests to start an application and/or end the application and/or requests to perform a particular action within the application.

Figure 24:
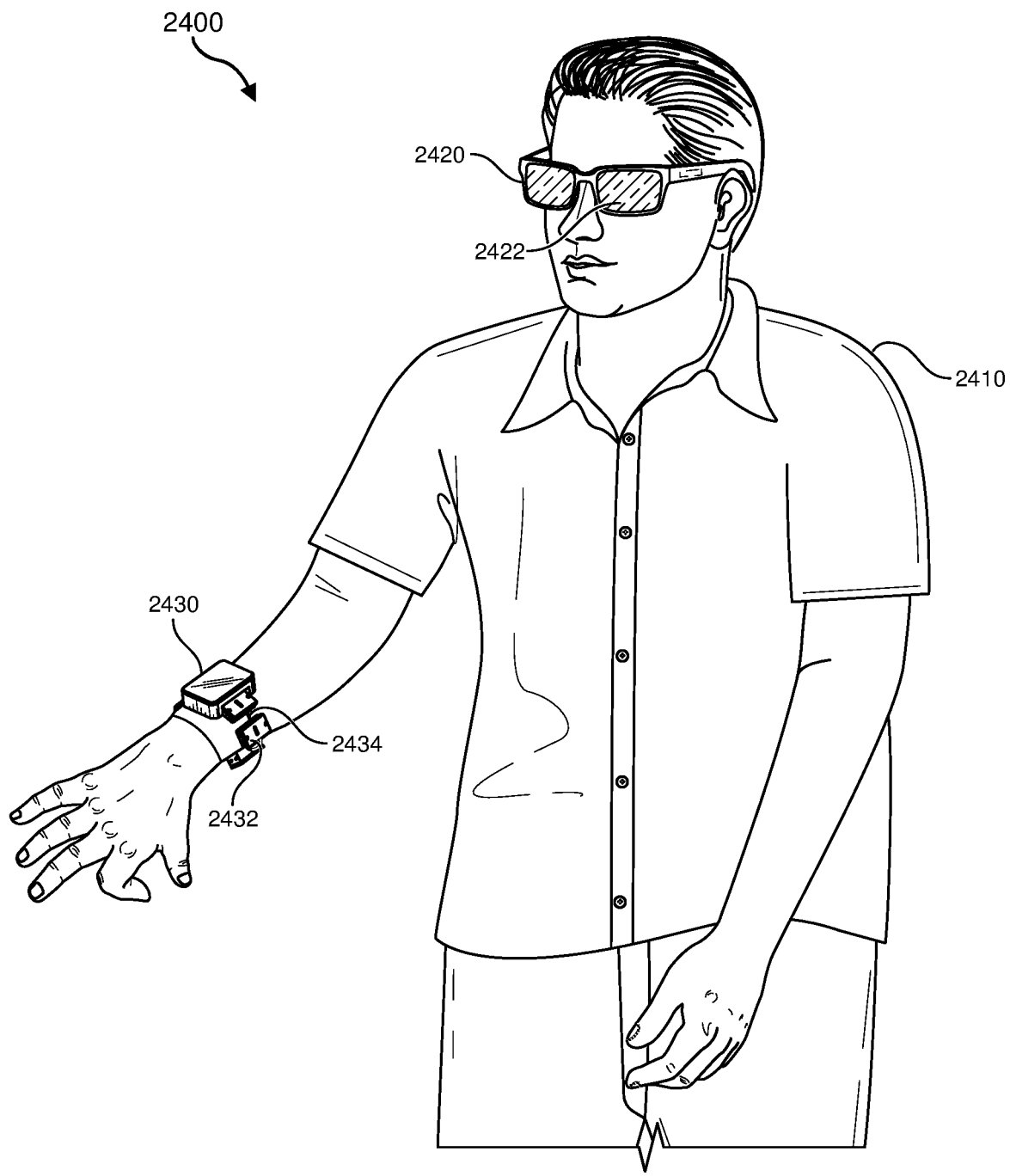
FIG. 24 is an illustration of an exemplary augmented-reality environment according to embodiments of this disclosure.

While haptic interfaces may be used with virtual-reality systems, as shown in FIG. 23, haptic interfaces may also be used with augmented-reality systems, as shown in FIG. 24. FIG. 24 is a perspective view a user 2410 interacting with an augmented-reality system 2400. In this example, user 2410 may wear a pair of augmented-reality glasses 2420 that have one or more displays 2422 and that are paired with a haptic device 2430. Haptic device 2430 may be a wristband that includes a plurality of band elements 2432 and a tensioning mechanism 2434 that connects band elements 2432 to one another.

One or more of band elements 2432 may include any type or form of actuator suitable for providing haptic feedback. For example, one or more of band elements 2432 may be configured to provide one or more of various types of cutaneous feedback, including vibration, force, traction, texture, and/or temperature. To provide such feedback, band elements 2432 may include one or more of various types of actuators. In some embodiments, an actuator may include a layer of electroactive polymer sandwiched between conductive electrodes. In one example, each of band elements 2432 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 2210, 2220, 2304, and 2430 may include any suitable number and/or type of haptic transducer, sensor, and/or feedback mechanism. For example, haptic devices 2210, 2220, 2304, and 2430 may include one or more mechanical transducers, piezoelectric transducers, and/or fluidic transducers. Haptic devices 2210, 2220, 2304, and 2430 may also include various combinations of different types and forms of transducers that work together or independently to enhance a user's artificial-reality experience. In one example, each of band elements 2432 of haptic device 2430 may include a vibrotactor (e.g., a vibrotactile actuator) configured to vibrate in unison or independently to provide one or more of various types of haptic sensations to a user.

As discussed throughout the instant disclosure, the disclosed devices, systems, and methods may provide one or more advantages over conventional devices, systems, and methods. For example, in contrast to prior devices, the electroactive devices presented herein may include electroactive elements that achieve substantially uniform strain in the presence of an electrostatic field produced by a potential difference between paired electrodes, permitting the electroactive devices to achieve, for example, improvements in both energy density and specific power density. Such uniform strain may reduce or eliminate unwanted deformations in the electroactive elements and may result in greater overall deformation, such as compression, of the electroactive elements, providing a greater degree of movement of surface regions of the electroactive elements while requiring a lower amount of energy to provide such deformation. The electroactive elements may include polymer materials having nanovoided regions that allow for additional compression in the presence of a voltage gradient in comparison to non-voided materials. Additionally, an electroactive device may be formed in a stacked structure having a plurality of gas-impregnated electroactive elements that are layered with multiple electrodes, enabling the plurality of electroactive elements to be actuated in conjunction with each other in a single device that may undergo a more substantial degree of deformation (e.g., compression and/or expansion) in comparison to an electroactive device having a single electroactive element or layer.

Electroactive devices described and shown herein may be utilized in any suitable technologies, without limitation. For example, such electroactive devices may be utilized as mechanical actuators to actuate movement of adjacent components. In at least one embodiment, the disclosed electroactive devices may be incorporated into optical systems such as adjustable lenses (e.g., fluid-filled lenses) to actuate movement of one or more optical layers. Such actuation may, for example, allow for selected movement of lens layers of an adjustable lens, resulting in deformation of the lens layers to adjust optical characteristics (e.g., focal point, spherical correction, cylindrical correction, axial correction, etc.) of the adjustable lens. In some embodiments, electroactive devices as disclosed herein may be utilized as actuators in micromechanical apparatuses, such as microelectromechanical devices. Additionally or alternatively, electroactive devices may be used for converting mechanical energy to electrical energy for use in energy harvesting systems and/or sensor apparatuses.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a mixture that comprises or includes conductive particles and polymerizable monomers include embodiments where a mixture consists essentially of conductive particles and polymerizable monomers and embodiments where a mixture consists of conductive particles and polymerizable monomers.

What is claimed is:

1. A mixture comprising at least 10 volume percent conductive particles dispersed within a network of a curable material, wherein:
    the conductive particles comprise at least one material selected from the group consisting of graphite, graphene, graphene oxide, gold nanoparticles, silver nanoparticles, palladium nanoparticles, platinum nanoparticles, transparent conductive oxides, carbon black, poly(3,4-ethylenedioxythiophene), and polystyrene sulfonate;
    a concentration of conductive particles either increases or decreases throughout at least a portion of the curable material;
    the mixture has a viscosity of less than approximately 100 Poise; and
    the conductive particles have an average particle size of less than approximately 100 nm.

2. The mixture of claim 1, wherein the conductive particles comprise a modified surface.

3. The mixture of claim 1, wherein the curable material comprises at least one material selected from the group consisting of acrylates, silicones, silicone acrylates, thiols, thiol acrylates, silanes, vinyls, isocyanates, epoxies, and urethanes.

4. The mixture of claim 1, further comprising a polymerizable surfactant.

5. The mixture of claim 1, further comprising a non-polymerizable surfactant.

6. The mixture of claim 1, further comprising a surfactant selected from the group consisting of an epoxy monomer, an epoxy acrylate, a polyimide, a mono(meth)acrylate, a di(meth)acrylate, an ethylene oxide-modified diol, and an ethylene oxide-modified acrylate.

7. The mixture of claim 1, wherein the mixture is free of a liquid solvent.

8. The mixture of claim 1, wherein the mixture further comprises embedded conductive regions each either increasing or decreasing in the conductive particles of the curable material.

* * * * *